United States Patent
Sugisawa et al.

(10) Patent No.: US 9,054,058 B2
(45) Date of Patent: Jun. 9, 2015

(54) LIGHT-EMITTING DEVICE, ELECTRONIC DEVICE, AND LIGHTING DEVICE

(75) Inventors: Nozomu Sugisawa, Kanagawa (JP); Kaoru Hatano, Kanagawa (JP); Shunpei Yamazaki, Tokyo (JP)

(73) Assignee: SEMICONDUCTOR ENERGY LABORATORY CO., LTD., Kanagawa-Ken (JP)

(*) Notice: Subject to any disclaimer, the term of this patent is extended or adjusted under 35 U.S.C. 154(b) by 6 days.

(21) Appl. No.: 13/535,839

(22) Filed: Jun. 28, 2012

(65) Prior Publication Data

US 2013/0001620 A1 Jan. 3, 2013

(30) Foreign Application Priority Data

Jul. 1, 2011 (JP) ................... 2011-147616

(51) Int. Cl.
*H01L 51/54* (2006.01)
*H01L 51/56* (2006.01)
*H01L 29/04* (2006.01)
*H01L 27/32* (2006.01)
*H01L 51/00* (2006.01)
*H01L 51/50* (2006.01)
*H01L 51/52* (2006.01)

(52) U.S. Cl.
CPC .......... *H01L 27/3246* (2013.01); *H01L 51/006* (2013.01); *H01L 51/0072* (2013.01); *H01L 51/0085* (2013.01); *H01L 51/506* (2013.01); *H01L 51/5064* (2013.01); *H01L 51/5076* (2013.01); *H01L 51/508* (2013.01); *H01L 51/525* (2013.01); *H01L 51/5278* (2013.01); *H01L 27/3211* (2013.01); *H01L 27/322* (2013.01); *H01L 27/3276* (2013.01)

(58) Field of Classification Search
CPC .......... H01L 51/54; H01L 51/56; H01L 29/04
USPC ....................... 313/504, 506; 257/72, 83, E27
See application file for complete search history.

(56) References Cited

U.S. PATENT DOCUMENTS

| 6,828,727 | B2 | 12/2004 | Yamazaki | |
|---|---|---|---|---|
| 7,834,543 | B2 | 11/2010 | Takata | |
| 2004/0251814 | A1 | 12/2004 | Nishikawa et al. | |
| 2007/0194321 | A1* | 8/2007 | Yamazaki et al. | 257/72 |
| 2009/0009069 | A1* | 1/2009 | Takata | 313/504 |
| 2010/0201260 | A1* | 8/2010 | Yamazaki et al. | 313/504 |
| 2011/0273080 | A1* | 11/2011 | Kimura et al. | 313/498 |

FOREIGN PATENT DOCUMENTS

| JP | 2004-227854 | 8/2004 |
|---|---|---|
| JP | 4644604 B2 | 4/2011 |

* cited by examiner

*Primary Examiner* — David Vu
*Assistant Examiner* — Mouloucoulaye Inoussa
(74) *Attorney, Agent, or Firm* — Husch Blackwell LLP

(57) ABSTRACT

A high-quality light-emitting device having low power consumption, capability of emitting light of a bright color, and less luminance unevenness is provided. Provided is a light-emitting device in which a plurality of light-emitting units each include a light-emitting element which includes a layer (EL layer) containing an organic compound between a first electrode and a second electrode. The first electrode is separated between light-emitting elements. The EL layer includes a layer (light-emitting layer) containing a light-emitting substance and a layer containing a donor substance and an acceptor substance provided between the first electrode and the light-emitting layer. An inversely tapered partition is provided only between adjacent light-emitting units emitting light of different colors.

18 Claims, 16 Drawing Sheets

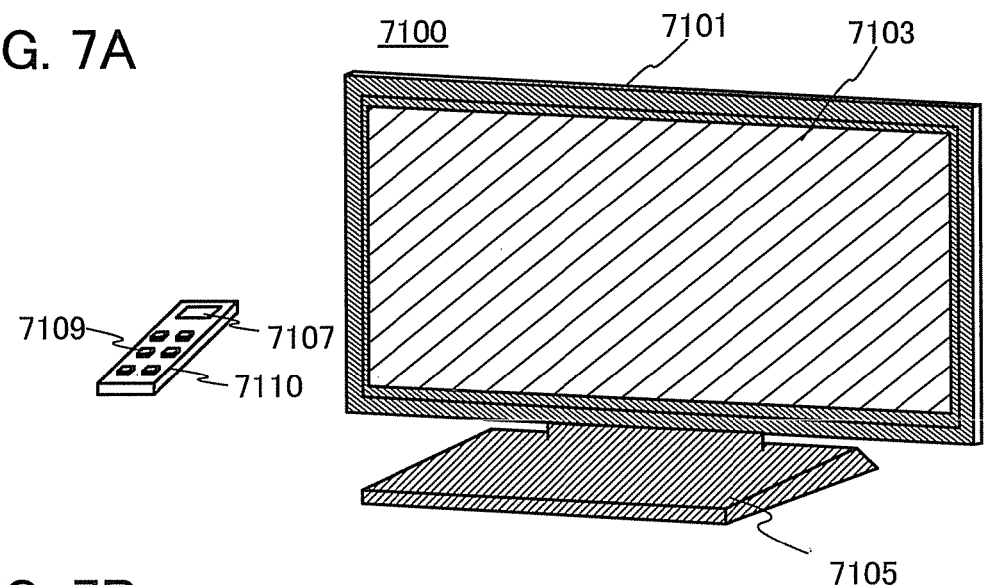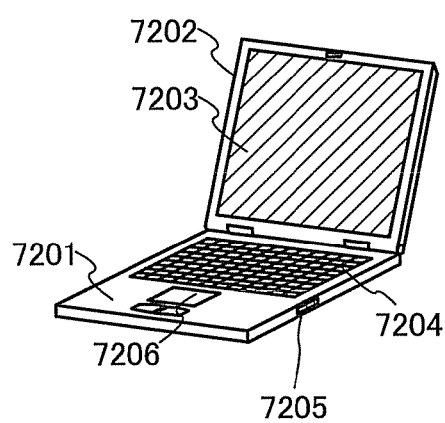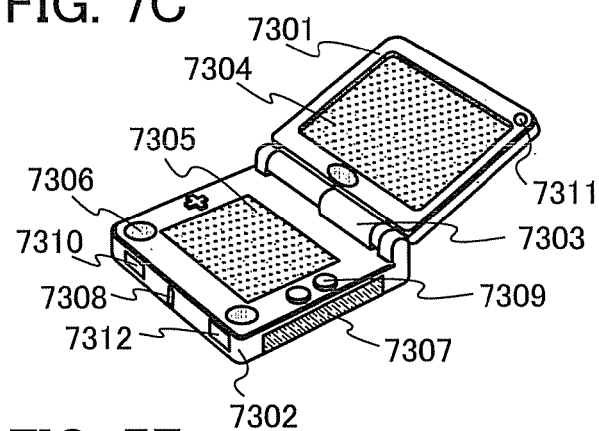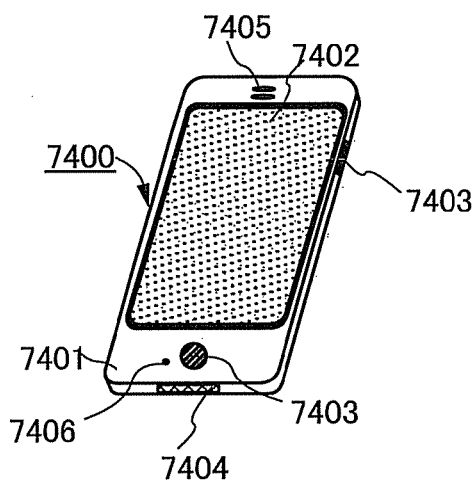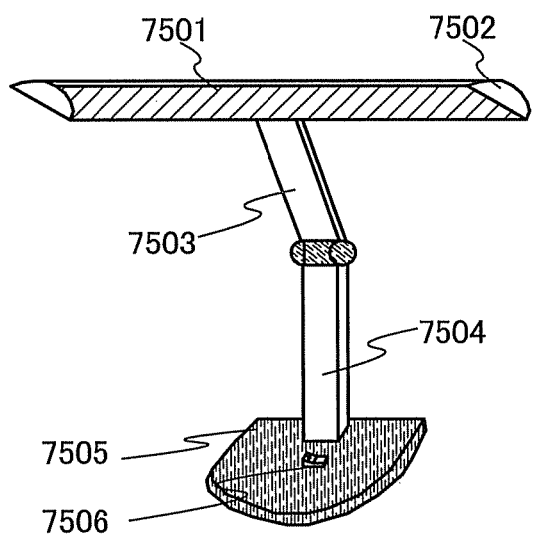

LIGHT-EMITTING DEVICE, ELECTRONIC DEVICE, AND LIGHTING DEVICE

BACKGROUND OF THE INVENTION

1. Field of the Invention

The present invention relates to a light-emitting device, an electronic device, and a lighting device utilizing organic electroluminescence (EL).

2. Description of the Related Art

A light-emitting element using an organic compound as a light-emitting body, which has characteristics such as feasibility of being thinner and lighter, high speed response to input signals, and capability of direct current low voltage driving, has been expected to be applied to next-generation flat panel displays or lighting devices. In particular, a display device in which light-emitting elements are arranged in a matrix is considered to have advantages of a wide viewing angle and excellent visibility over a conventional liquid crystal display device.

The emission mechanism of a light-emitting element (organic EL element) using an organic compound as a light-emitting body is as follows. First, when voltage is applied between a pair of electrodes with a layer (EL layer) containing a light-emitting organic compound provided therebetween, electrons injected from a cathode and holes injected from an anode are transported to the EL layer, so that current flows. Then, the injected electrons and holes bring the light-emitting organic compound contained in the EL layer into an excited state, so that light is emitted from the excited light-emitting organic compound. Singlet excitation and triplet excitation are known as excited states, and light emission can probably be achieved through either of the excited states.

An EL layer included in a light-emitting element includes at least a light-emitting layer. In addition, the EL layer can have a stacked-layer structure including a hole-injection layer, a hole-transport layer, an electron-transport layer, an electron-injection layer, and/or the like, in addition to the light-emitting layer.

In the case of manufacturing a device for displaying full-color images, it is necessary to arrange light-emitting elements which emit light of at least three colors of red, green, and blue in a matrix. Examples of methods for obtaining such a structure include a method in which necessary portions of EL layers are separately colored so that light-emitting elements emitting light of different colors are provided (hereinafter such a method is referred to as a separate coloring method), a method in which each color is obtained by formation of light-emitting elements all of which emit white light and transmission of the white light through respective color filters (hereinafter such a method is referred to as a color filter method), and a method in which each color is obtained by formation of light-emitting elements all of which emit blue light or light having a shorter wavelength than blue light and transmission of the blue light or light having the shorter wavelength than blue light through respective color conversion layers (hereinafter such a method is referred to as a color conversion method). For example, Patent Document 1 discloses an organic EL display device using a color filter method.

REFERENCE

Patent Document

[Patent Document 1] Japanese Published Patent Application No. 2004-227854

SUMMARY OF THE INVENTION

In order to put displays and lighting devices using organic EL elements into practical use, it has been required to reduce power consumption of light-emitting devices using organic EL elements. In addition, high-quality light-emitting devices which can emit light of a bright color and have less luminance unevenness have been required.

An organic EL element included in a light-emitting device includes an EL layer, which includes a layer (light-emitting layer) containing a light-emitting substance, between a first electrode separated between elements and a second electrode overlapping with the first electrode. In order to manufacture a light-emitting device with low power consumption, light-emitting elements are required to have low driving voltage. For example, driving voltage of a light-emitting element can be reduced by provision of a layer having high conductivity in an EL layer.

In the case where the light-emitting device includes a plurality of organic EL elements, however, when the EL layer includes a layer having high conductivity between the first electrode and the light-emitting layer, a phenomenon tends to occur in which current flows from a light-emitting element to an adjacent light-emitting element through the layer having high conductivity. In such a manner, current flow from a light-emitting element in an emission state may cause an adjacent light-emitting element in a non-emission state to emit light. In particular, occurrence of unintentional light emission of a light-emitting element in adjacent light-emitting units emitting light of different colors makes it difficult for the light-emitting device to display a desired color or a bright color.

In view of the above, an object of one embodiment of the present invention is to provide a high-quality light-emitting device having low power consumption, capability of emitting light of a bright color, and less luminance unevenness.

Another object of one embodiment of the present invention is to provide an electronic device including the light-emitting device or a lighting device including the light-emitting device.

In order to prevent current flow from a light-emitting element in an emission state to a light-emitting element in a non-emission state through a layer having high conductivity between two light-emitting units emitting light of different colors, it is required that a current path do not exist between these light-emitting units, the shortest current path therebetween be long, or the shortest current path therebetween be narrow. In one embodiment of the present invention, a layer having high conductivity is provided between a first electrode and a light-emitting layer, and an inversely tapered partition is provided only between adjacent light-emitting units emitting light of different colors to separate an EL layer (at least the layer having high conductivity) between the light-emitting units.

This structure can prevent current flow from a light-emitting element in an emission state to a light-emitting element in a non-emission state between adjacent light-emitting units emitting light of different colors. Thus, unintentional light emission of the light-emitting element in a non-emission state can be prevented.

Further, the inversely tapered partition is not provided between adjacent light-emitting units emitting light of the same color. Thus, an increase in resistance of the second electrode can be suppressed. This can prevent light-emission defects caused by a potential drop due to the resistance of the second electrode, so that luminance unevenness in a light-emitting device can be prevented.

Specifically, one embodiment of the present invention is a light-emitting device in which a plurality of light-emitting units each include a light-emitting element which includes a layer (EL layer) containing an organic compound between a first electrode and a second electrode. The first electrode is separated between light-emitting elements. The EL layer includes a layer (light-emitting layer) containing a light-emitting substance and a layer containing a donor substance and an acceptor substance provided between the first electrode and the light-emitting layer. An inversely tapered partition is provided only between adjacent light-emitting units emitting light of different colors.

In the above light-emitting device, it is preferable that a first light-emitting unit and a second light-emitting unit emitting light of different colors be provided adjacent to each other with the partition placed therebetween, and that the length of a long side of an upper surface shape of the partition be more than or equal to 90% of the length of a side of the first light-emitting unit facing the second light-emitting unit.

The above structure can make the shortest current path from the light-emitting element of the first light-emitting unit to the light-emitting element of the second light-emitting unit sufficiently narrow.

In the above light-emitting device, the EL layer (at least the layer containing a donor substance and an acceptor substance) is preferably separated between light-emitting units emitting light of different colors provided adjacent to each other with the partition placed therebetween.

The above structure is particularly preferable because, between the light-emitting units emitting light of different colors provided adjacent to each other with the partition placed therebetween, a current path from the EL layer of one light-emitting unit to the EL layer of the other light-emitting unit does not exist.

In the above light-emitting device, it is preferable that light-emitting units emitting light of the same color arranged in one direction include the second electrode formed from a same layer, and that the second electrode be electrically connected to a common wiring outside a light-emitting portion including the plurality of light-emitting units.

This structure can prevent light-emission defects caused by a potential drop due to the resistance of the second electrode, so that luminance unevenness in the light-emitting device can be prevented.

In the above light-emitting device, the common wiring is preferably provided to surround the light-emitting portion.

With this structure, electrostatic discharge (ESD) of elements such as a light-emitting element and a transistor included in the light-emitting portion can be prevented from being caused by high voltage due to static electricity generated when the light-emitting device is being fabricated or is used.

In the above light-emitting device, the donor substance is preferably an alkali metal, an alkaline earth metal, a rare earth metal, an alkali metal compound, an alkaline earth metal compound, or a rare earth metal compound.

In the above light-emitting device, the layer containing, an organic compound preferably includes a first layer including a layer containing a light-emitting organic compound, a second layer including a layer containing a light-emitting organic compound, and an intermediate layer provided between the first layer and the second layer.

Another embodiment of the present invention is an electronic device including the above light-emitting device in a display portion. Another embodiment of the present invention is a lighting device including the above light-emitting device in a lighting portion.

The above light-emitting device includes a layer having high conductivity in the EL layer; thus, an electronic device or a lighting device with low power consumption can be provided.

The inversely tapered partition that is provided only between adjacent light-emitting units emitting light of different colors can prevent current flow from one light-emitting element in an emission state to the other light-emitting element in a non-emission state between these light-emitting units. Thus, unintentional light emission of the light-emitting element in a non-emission state can be prevented.

Further, the inversely tapered partition is not provided between adjacent light-emitting units emitting light of the same color. Thus, an increase in resistance of the second electrode can be suppressed. This can prevent light-emission defects caused by a potential drop due to the resistance of the second electrode, so that luminance unevenness in the light-emitting device can be prevented.

Consequently, a high-quality electronic device or lighting device which can emit light of a bright color and has less luminance unevenness can be achieved.

According to one embodiment of the present invention, a high-quality light-emitting device having low power consumption, capability of emitting light of a bright color, and less luminance unevenness can be provided.

Further, according to one embodiment of the present invention, an electronic device including the light-emitting device or a lighting device including the light-emitting device can be provided.

BRIEF DESCRIPTION OF THE DRAWINGS

FIGS. 7A to 7E illustrate examples of an electronic device of one embodiment of the present invention.

DETAILED DESCRIPTION OF THE INVENTION

Figure 1A:
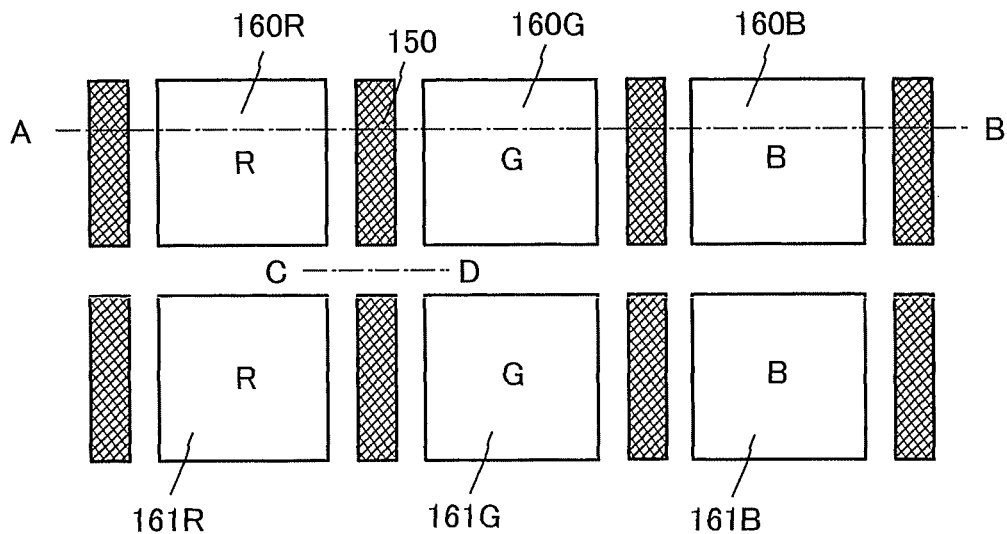
FIGS. 1A to 1D illustrate an example of a light-emitting device of one embodiment of the present invention.

Embodiments and examples will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be construed as being limited to the descriptions of the embodiments and the examples below. Note that in the structures of the invention described below, the same portions or portions having similar functions are denoted by the same reference numerals in different drawings, and description of such portions is not repeated.

Embodiment 1

In this embodiment, a light-emitting device according to one embodiment of the present invention is described with reference to FIGS. 1A to 1D, FIGS. 2A to 2D, and FIGS. 3A to 3D.

The light-emitting device according to one embodiment of the present invention includes a plurality of light-emitting units. Each light-emitting unit includes a light-emitting element which includes a layer (EL layer) containing an organic compound between a first electrode and a second electrode. The first electrode is separated between light-emitting elements. The EL layer includes a layer containing a light-emitting substance and a layer having high conductivity provided between the first electrode and the layer containing a light-emitting substance. Accordingly, a light-emitting element having low driving voltage or a light-emitting device with low power consumption can be achieved in one embodiment of the present invention.

In addition, the light-emitting device according to one embodiment of the present invention includes an inversely tapered partition only between adjacent light-emitting units emitting light of different colors. Thus, in one embodiment of the present invention, even in the above structure in which the EL layer includes a layer having high conductivity, it is possible to prevent current flow from one light-emitting element in an emission state to the other light-emitting element in a non-emission state between adjacent light-emitting units emitting light of different colors. Consequently, unintentional light emission of a light-emitting unit in a non-emission state can be prevented, so that a light-emitting device capable of emitting light of a bright color can be provided.

The inversely tapered partition is not provided between adjacent light-emitting units emitting light of the same color. Thus, an increase in resistance of the second electrode can be suppressed. This can prevent light-emission defects caused by a potential drop due to the resistance of the second electrode, so that luminance unevenness in the light-emitting device can be prevented.

Figure 1B:
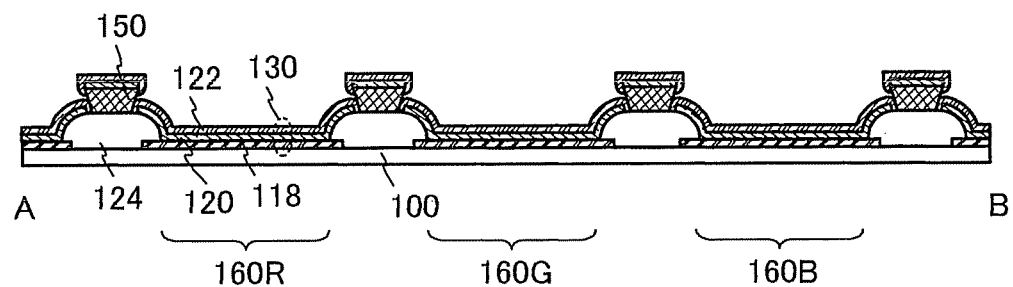
Figure 1C:
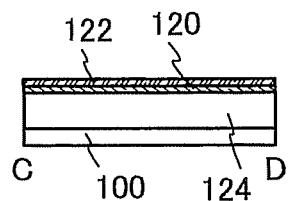

FIG. 1A illustrates an example of the positional relation between inversely tapered partitions 150 (upper surface shapes thereof) and light-emitting units in the light-emitting device according to one embodiment of the present invention. FIGS. 1B and 1C are cross-sectional views taken along lines A-B and C-D, respectively, in FIG. 1A.

Note that in this embodiment, the light-emitting device expresses one color with light-emitting units of three colors of R (red), G (green), and B (blue); however, colors other than R, G, and B, such as yellow, cyan, and magenta, may be used as color elements. In this embodiment, the EL layers included in the light-emitting units have the same structure (e.g., emit white light). Each light-emitting unit is provided with a color filter or a color conversion layer (not shown); for example, a red light-emitting unit includes a red color filter and emits red color light.

As illustrated in FIG. 1B, a red light-emitting unit 160R includes a light-emitting element 130 (a first electrode 118, an EL layer 120, and a second electrode 122) over an insulating surface 100. An end portion of the first electrode 118 is covered with an insulating layer 124 having a tapered shape. Similarly, a green light-emitting unit 160G and a blue light-emitting unit 160B each include a light-emitting element over the insulating surface 100. The EL layer included in each light-emitting element includes a layer containing a light-emitting substance and a layer having high conductivity provided between the first electrode and the layer containing a light-emitting substance. Accordingly, a light-emitting element having low driving voltage or a light-emitting device with low power consumption can be achieved in one embodiment of the present invention.

Examples of the layer having high conductivity include a layer which transmits visible light and contains a highly conductive substance (e.g., indium tin oxide ($In_2O_3$—$SnO_2$, also referred to as ITO)) and a layer which contains a donor substance and an acceptor substance. As the layer which contains a donor substance and an acceptor substance, specifically, a layer in which an alkali metal, an alkaline earth metal, a rare earth metal, an alkali metal compound, an alkaline earth metal compound, or a rare earth metal compound is added to an organic compound, or a layer containing a conductive polymer such as poly(3,4-ethylenedioxythiophene)/poly(styrenesulfonic acid) (PEDOT/PSS) can be used. The layer which contains a donor substance and an acceptor substance may contain a donor substance and an acceptor substance in the same film, or may be a stack of a layer containing a donor substance and a layer containing an acceptor substance. Specific structures of the light-emitting element and materials which can be used for the light-emitting element will be described in detail in Embodiments 3 and 4.

In the light-emitting device illustrated in FIGS. 1A and 1B, the inversely tapered partition 150 is provided over the insulating layer 124 between adjacent light-emitting units emitting light of different colors, such as between the red light-emitting unit 160R and the green light-emitting unit 160G and between the green light-emitting unit 160G and the blue light-emitting unit 160B.

In this specification, an "inversely tapered" shape refers to a shape in which the side portion or the upper portion thereof is on the outer side than the bottom portion in the direction parallel to the insulating surface.

The partition 150 can be formed using an inorganic insulating material, an organic insulating material, or a metal material. As the organic insulating material, for example, a negative or positive photosensitive resin material, a non-photosensitive resin material, or the like can be used. As the metal material, titanium, aluminum, or the like can be used.

The partition 150 illustrated in FIG. 1B can be formed by forming an organic film with negative photosensitivity and performing light exposure and development treatment, for example. Here, the intensity of the exposure is adjusted to decrease toward a lower portion of the organic film, whereby the partition 150 can have an inversely tapered shape. Alternatively, the partition 150 can be formed by forming a film which is formed of an inorganic material, performing patterning on a desired region, and processing the film formed of the inorganic material. The film formed of the inorganic material can be formed using, for example, an inorganic insulating material such as silicon oxide or silicon nitride, a conductive material such as titanium or aluminum, or the like.

A film formed over such inversely tapered partitions can be physically separated at the partitions. For example, the EL layer 120 formed over the partitions 150 is electrically separated at the partitions 150, as illustrated in FIG. 1B. Thus, current can be prevented from flowing from a light-emitting element to an adjacent light-emitting element through the partition 150.

In the case of using a conductive material for the partition 150, it is preferable that the partition 150 be not in contact with at least the layer having high conductivity of the EL layer 120. It is further preferable that the second electrode 122 be provided in contact with the partition 150. With such a structure, while current flow from a light-emitting element to an adjacent light-emitting element through the partition 150, which causes unintentional light emission is prevented, the second electrode 122 is electrically continuous through the partition 150 so that a current path is secured; thus, a potential drop due to the resistance of the second electrode 122 can be suppressed.

Note that the partition 150 may have any shape as long as it can separate the EL layer (at least the layer having high conductivity).

Figure 1D:
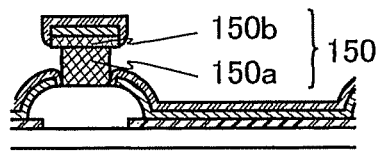

FIG. 1D illustrates another example of a cross-sectional shape of a partition which can be applied to one embodiment of the present invention. The partition 150 having a T-shape illustrated in FIG. 1D includes a leg portion 150a and a stage portion 150b.

As a method for forming the partition 150 including the leg portion 150a and the stage portion 150b, for example, a film formed of an organic insulating material is formed, and a film formed of an inorganic insulating material is formed thereover. After that, patterning is performed on a desired region, the film formed of the inorganic insulating material is processed, and then the film formed of the organic insulating material is processed using the film formed of the inorganic insulating material as a mask (so-called hard mask). The film formed of the organic insulating material can be processed by wet etching, dry etching, or the like. A portion formed using the film formed of the organic insulating material is the leg portion 150a, and a portion formed using the film formed of the inorganic insulating material is the stage portion 150b.

As a material used for the leg portion 150a, for example, a negative or positive photosensitive resin material, a non-photosensitive resin material, or the like can be used. In the case where a light-shielding material is used for the stage portion 150b, the leg portion 150a may be formed by light exposure or the like using the stage portion 150b as a light-shielding film.

As a material used for the stage portion 150b, for example, an inorganic insulating material such as silicon oxide or silicon nitride, a conductive metal material such as titanium or aluminum, or the like can be used.

Note that it is also possible to use an inorganic insulating material for the leg portion 150a and a photosensitive organic material for the stage portion 150b. Alternatively, inorganic materials with different etching rates may be used in combination for the leg portion 150a and the stage portion 150b. Further alternatively, organic resin films having opposite photosensitivity may be used as the leg portion 150a and the stage portion 150b. Although FIG. 1D illustrates the case where the partition 150 has a two-layer structure, the partition 150 may also have a single-layer structure or a multi-layer structure including three or more layers.

It is preferable to form the partition 150 using a light-shielding material, because light emitted from a light-emitting element can be prevented from leaking into an adjacent light-emitting unit.

<About Between Adjacent Light-Emitting Units Emitting Light of Different Colors>

Description is made below using the partition 150 between the red light-emitting unit 160R and the green light-emitting unit 160G as an example. In FIGS. 3A to 3D, arrows indicate current paths in the EL layer at the time when the light-emitting element in the red light-emitting unit 160R is in an emission state and the light-emitting element in the green light-emitting unit 160G is in a non-emission state.

The light-emitting device illustrated in FIGS. 1A and 1B includes the partition 150 between the red light-emitting unit 160R and the green light-emitting unit 160G. The length of a long side of the upper surface shape of the partition 150 is substantially the same as the length of a side of the red light-emitting unit 160R facing the green light-emitting unit 160G (or a side of the green light-emitting unit 160G facing the red light-emitting unit 160R).

The EL layer is not separated in a region where the partition 150 is not provided, as illustrated in FIG. 1C, whereas the EL layer is separated in a region where the partition 150 is provided, as illustrated in FIG. 1B.

Figure 3A:
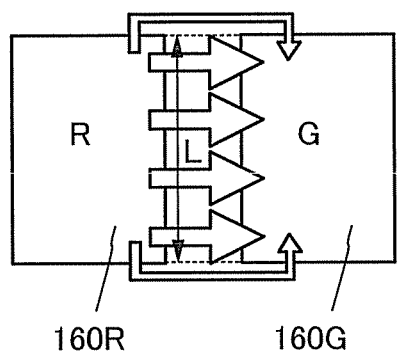
FIGS. 3A to 3D each illustrate an example of a light-emitting device of one embodiment of the present invention.
Figure 3B:
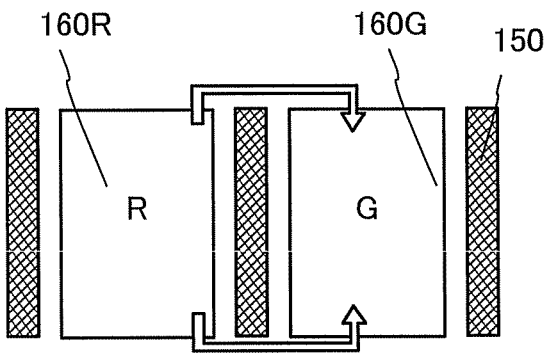
Figure 3C:
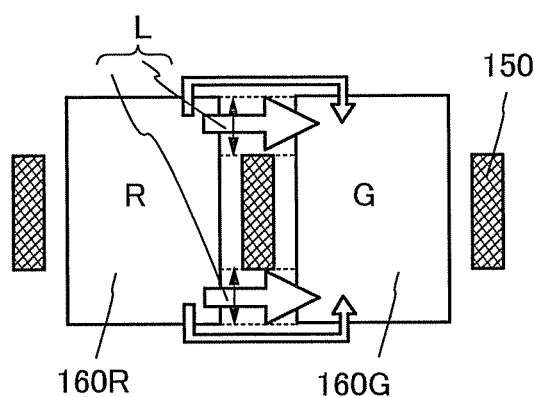

Such a structure can increase the length of the shortest current path from the EL layer of the red light-emitting unit 160R to the EL layer of the green light-emitting unit 160G (FIG. 3B) as compared to a structure without the partition 150 (FIG. 3A). Thus, current can be prevented from flowing from the light-emitting element of the red light-emitting unit 160R in an emission state to the light-emitting element of the green light-emitting unit 160G in a non-emission state, so that unintentional light emission of a light-emitting unit in a non-emission state can be prevented.

The upper surface shape of the partition 150 is not limited to the above. FIGS. 2A to 2D illustrate other examples of the positional relation between the inversely tapered partitions 150 and the light-emitting units in the light-emitting device according to one embodiment of the present invention.

Figure 2A:
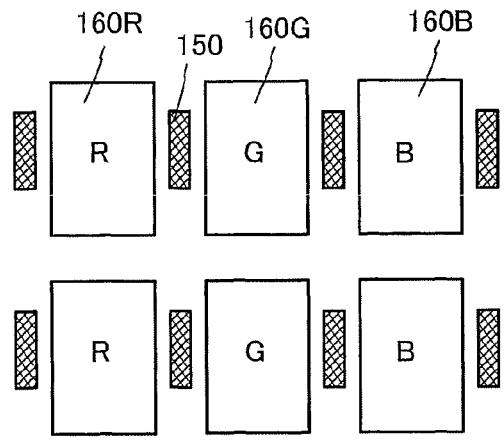
FIGS. 2A to 2D each illustrate an example of a light-emitting device of one embodiment of the present invention.

The light-emitting device illustrated in FIG. 2A includes the partition 150 between the red light-emitting unit 160R and the green light-emitting unit 160G. The length of the long side of the upper surface shape of the partition 150 is 50% of the length of the side of the red light-emitting unit 160R facing the green light-emitting unit 160G (or the side of the green light-emitting unit 160G facing the red light-emitting unit 160R).

Such a structure can narrow the width L of the shortest current path from the EL layer of the red light-emitting unit 160R to the EL layer of the adjacent green light-emitting unit 160G (FIG. 3C) as compared to the structure without the partition 150 (FIG. 3A). Thus, current can be prevented from flowing from the light-emitting element of the red light-emitting unit 160R in an emission state to the light-emitting element of the green light-emitting unit 160G in a non-emission state through the layer having high conductivity, so that unintentional light emission of a light-emitting unit in a non-emission state can be prevented.

Figure 2B:
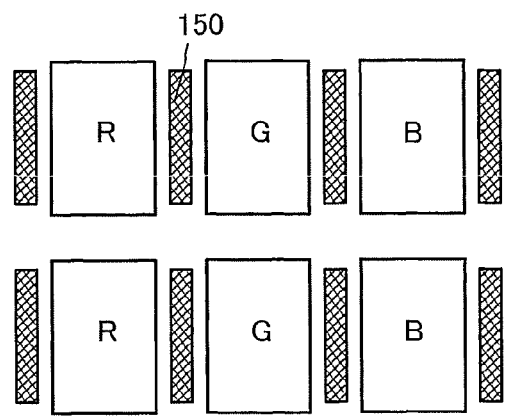

As illustrated in FIG. 2B, the length of the long side of the upper surface shape of the partition 150 is preferably more than or equal to 90% of the length of the side of the red light-emitting unit 160R facing the green light-emitting unit 160G (or the side of the green light-emitting unit 160G facing the red light-emitting unit 160R). This is because the width of the shortest current path from the EL layer of the red light-emitting unit 160R to the EL layer of the adjacent green light-emitting unit 160G can be especially narrowed when the long side of the upper surface shape of the partition 150 is long.

Figure 2C:
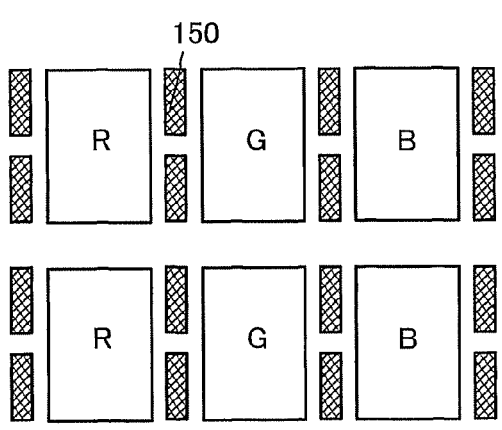

As illustrated in FIG. 2C, a plurality of partitions 150 may be provided between adjacent light-emitting units emitting light of different colors.

In the structures illustrated in FIGS. 1A to 1D and FIGS. 2A to 2C, the second electrode of the red light-emitting unit 160R is electrically connected to the second electrode of the adjacent green light-emitting unit 160G. Such a structure can prevent light-emission defects caused by a potential drop due to the resistance of the second electrode, so that luminance unevenness in the light-emitting device can be prevented.

Figure 2D:
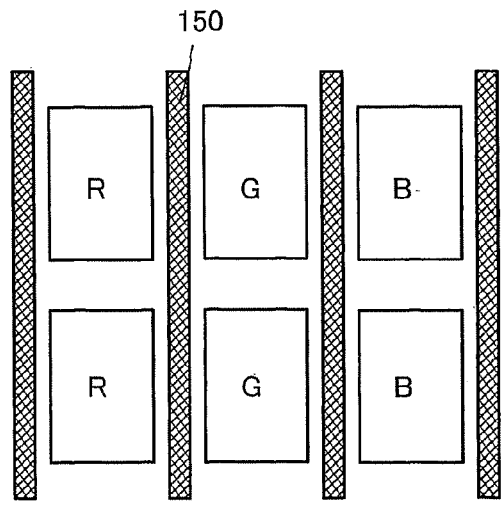
Figure 3D:
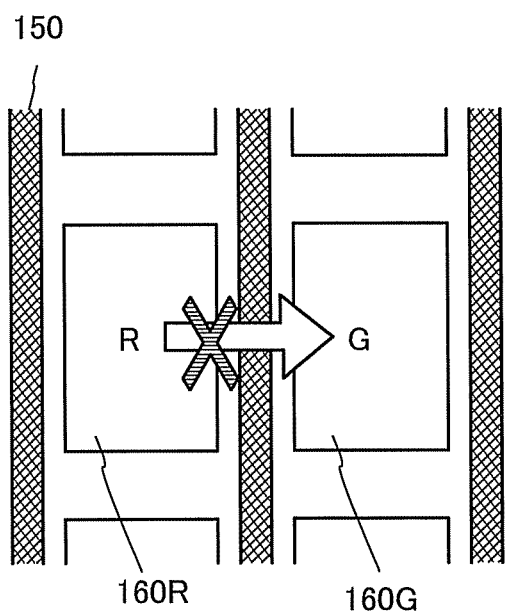

In FIG. 2D, the EL layer of the red light-emitting unit 160R and the EL layer of the adjacent green light-emitting unit 160G are separated from each other with the partition 150 placed therebetween, so that a current path from the EL layer of the red light-emitting unit 160R to the EL layer of the adjacent green light-emitting unit 160G does not exist (FIG. 3D). This structure is further preferable because it can especially prevent current from flowing from the light-emitting element of the red light-emitting unit 160R in an emission state to the light-emitting element of the green light-emitting unit 160G in a non-emission state.

<About Between Light-Emitting Units Emitting Light of the Same Color Arranged in One Direction>

In the light-emitting device illustrated in FIGS. 1A and 1B, only the insulating layer 124 is provided and the inversely tapered partition 150 is not provided over the insulating layer 124 between light-emitting units emitting light of the same color arranged in one direction, such as between the red light-emitting unit 160R and a red light-emitting unit 161R, between the green light-emitting unit 160G and a green light-emitting unit 161G, and between the blue light-emitting unit 160B and a blue light-emitting unit 161B.

This structure can prevent light-emission defects caused by a potential drop due to the resistance of the second electrode, so that luminance unevenness in the light-emitting device can be prevented.

As described above, in the light-emitting device according to one embodiment of the present invention, a layer having high conductivity is provided between the first electrode and the light-emitting layer, and an inversely tapered partition is provided only between adjacent light-emitting units emitting light of different colors. With such a structure, a high-quality light-emitting device having low power consumption, capability of emitting light of a bright color, and less luminance unevenness can be provided.

This embodiment can be combined with any of the other embodiments as appropriate.

Embodiment 2

In this embodiment, a light-emitting device according to one embodiment of the present invention is described with reference to FIGS. 4A to 4C. The light-emitting device according to one embodiment of the present invention, which includes a common wiring outside a light-emitting portion including the light-emitting units described in Embodiment 1, is described in detail.

In the light-emitting device according to one embodiment of the present invention, light-emitting units emitting light of the same color arranged in one direction include a second electrode formed from one layer. The common wiring is electrically connected to the second electrode and supplies a common potential to the second electrode. This structure can suppress a potential drop of the second electrode, thereby providing a high-quality light-emitting device with less luminance unevenness.

Figure 4A:
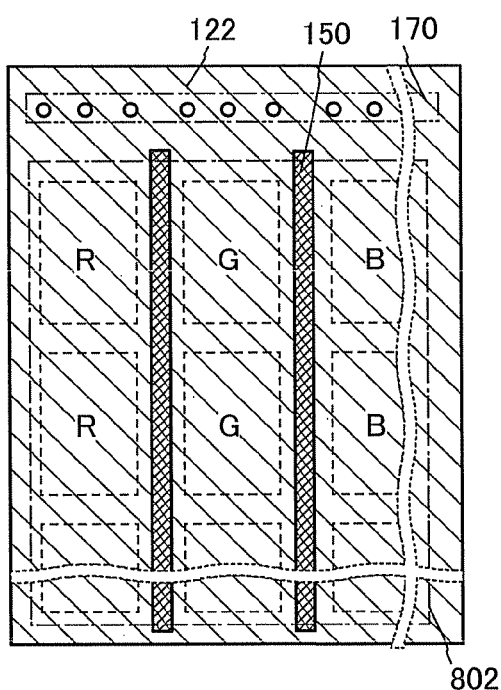
FIGS. 4A to 4C each illustrate an example of a light-emitting device of one embodiment of the present invention.
Figure 4B:
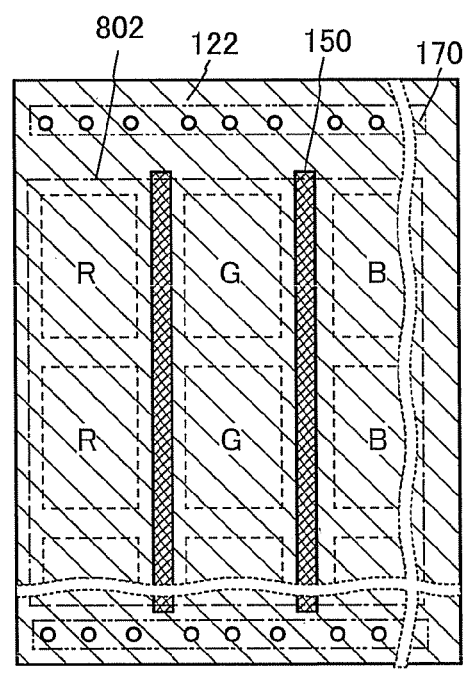
Figure 4C:
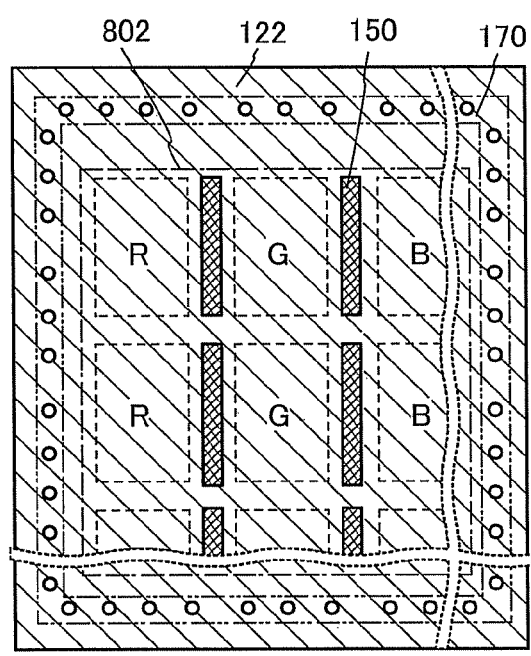

FIGS. 4A to 4C illustrate examples of the positional relation between the inversely tapered partitions 150, the second electrode 122, and a common wiring 170 in the light-emitting device according to one embodiment of the present invention. Note that in FIGS. 4A to 4C, a conductive film provided over the partition 150 (a film which is provided in forming the second electrode 122) is not shown.

As illustrated in FIGS. 4A to 4C, the common wiring 170 is provided outside a light-emitting portion 802. Note that the EL layers included in the light-emitting elements are provided at least in the light-emitting portion 802.

As illustrated in FIGS. 4A and 4B, the common wiring 170 is provided so that, in an upper surface shape, the long axis thereof is substantially perpendicular to the long axis of the partition 150.

In particular, when a pair of common wirings 170 are provided so that the long axes thereof are substantially perpendicular to the long axis of the partition in the upper surface shape, as illustrated in FIG. 4B, distribution of potentials in the second electrode can be improved in the light-emitting units emitting light of the same color arranged in one direction. This structure is preferable because it can suppress luminance unevenness in the light-emitting device.

Furthermore, even in the structures illustrated in FIGS. 4A and 4B where the partition 150 is provided between adjacent light-emitting units emitting light of different colors and the second electrode is electrically discontinuous between those light-emitting units, a common potential can be applied to the second electrode through the common wiring 170 in the adjacent light-emitting units emitting light of different colors.

As illustrated in FIG. 4C, the common wiring 170 may be provided to surround the light-emitting portion 802. With such a structure, electrostatic discharge (ESD) of elements such as a light-emitting element and a transistor included in the light-emitting portion can be prevented from being caused by high voltage due to static electricity generated when the light-emitting device is being fabricated or is used.

In the structure illustrated in FIG. 4C where the partition 150 is provided between adjacent light-emitting units emitting light of different colors and the second electrode is electrically continuous between those light-emitting units, the common wiring 170 is provided to surround the light-emitting portion 802 and be electrically connected to the second electrode 122, whereby distribution of potentials in the second electrode can be improved in the entire light-emitting portion 802. This structure is preferable because it can suppress luminance unevenness in the light-emitting device.

The common wiring 170 can be provided without an increase in the number of steps by being formed using the same layer as a wiring, an electrode, or the like included in the light-emitting unit. For example, the common wiring 170 can be formed using the same layer as the first electrode of the light-emitting element. In the case where the light-emitting unit includes a transistor, the common wiring 170 can be formed using the same layer as an electrode or the like of the transistor.

As described above, a common wiring electrically connected to the second electrode is provided in the light-emitting device according to one embodiment of the present invention. This structure can suppress a potential drop of the second electrode, thereby providing a high-quality light-emitting device with less luminance unevenness.

This embodiment can be combined with any of the other embodiments as appropriate.

Embodiment 3

Figure 5A:
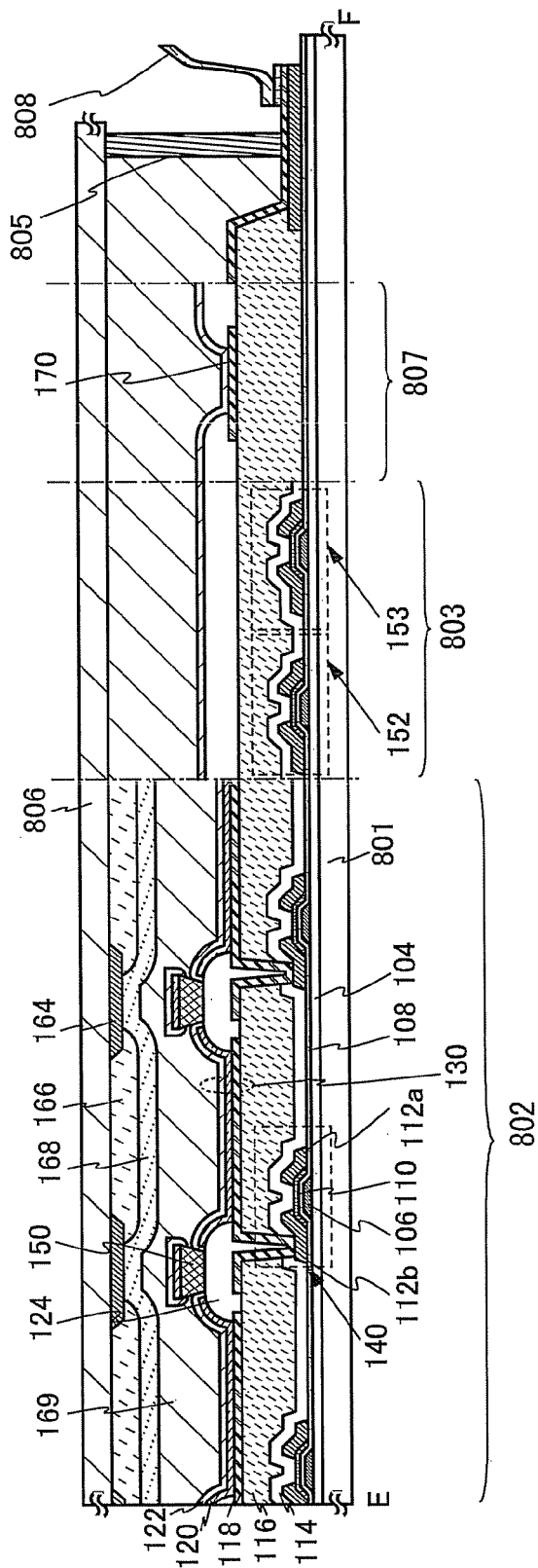
FIGS. 5A and 5B each illustrate an example of a light-emitting device of one embodiment of the present invention.
Figure 5B:
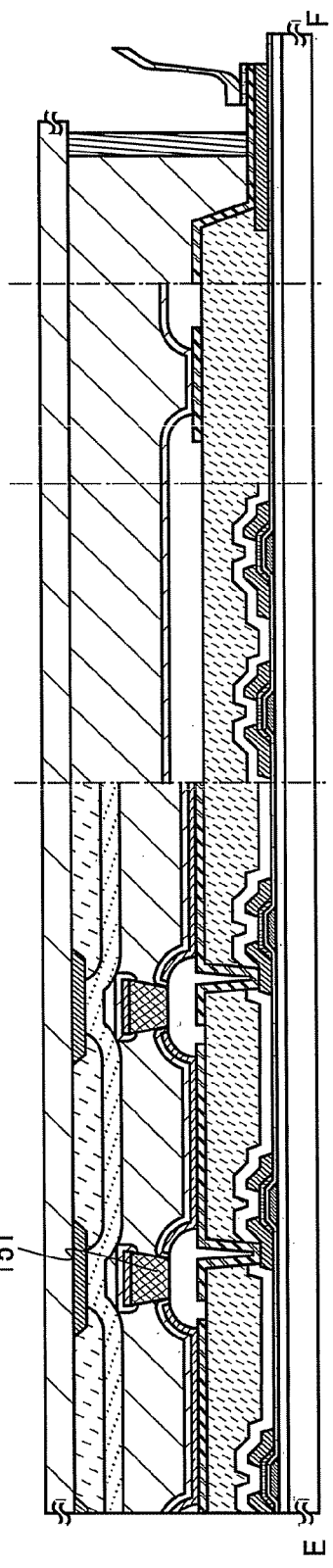
Figure 9:
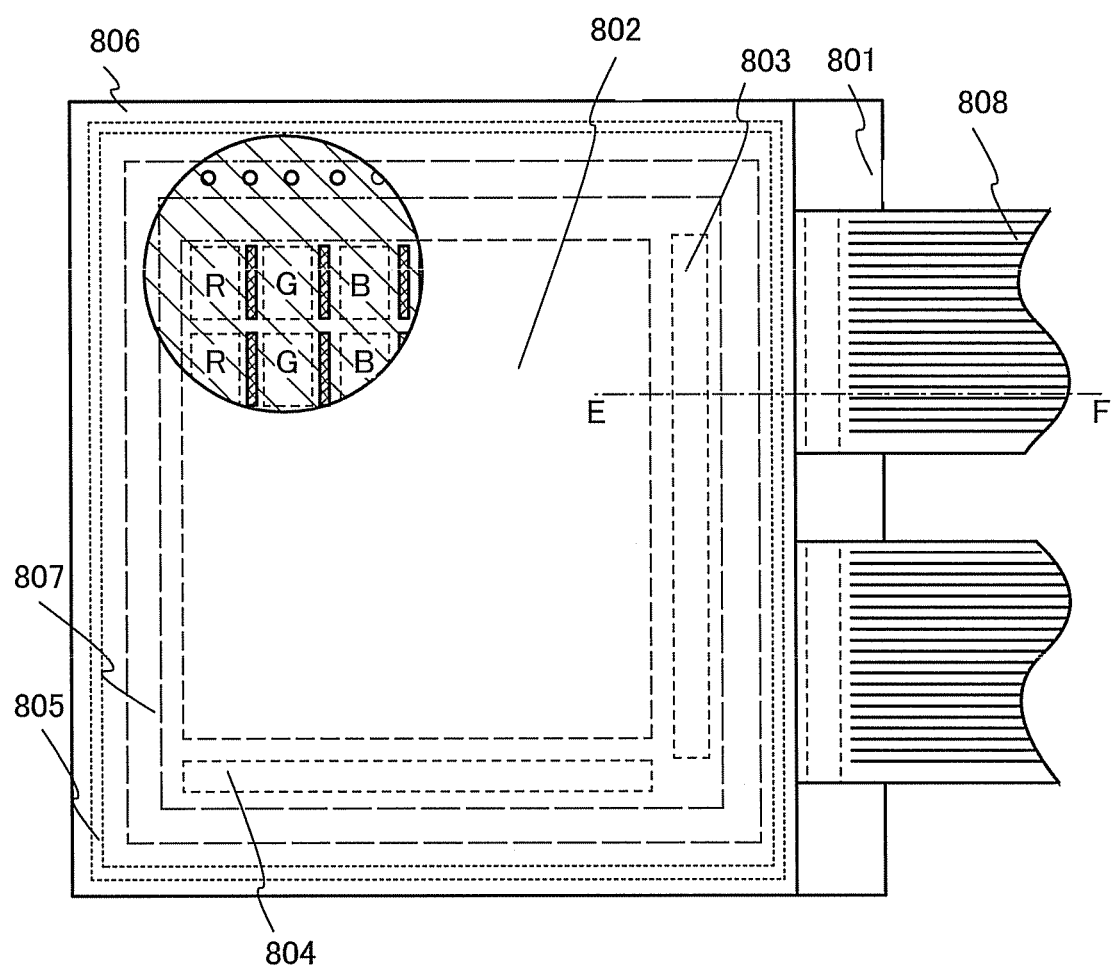
FIG. 9 illustrates an example of a light-emitting device of one embodiment of the present invention.

A light-emitting device according to one embodiment of the present invention is described with reference to FIGS. 5A and 5B and FIG. 9. FIG. 9 is a plan view of a light-emitting device and FIGS. 5A and 5B are cross-sectional views taken along chain line E-F in FIG. 9. In FIG. 9, some of the components, e.g., an insulating layer 104, are omitted. The structures in FIGS. 5A and 5B are the same except for the structure of the partition.

A light-emitting device in this embodiment includes a plurality of light-emitting units in a light-emitting portion. Each light-emitting unit includes a light-emitting element which includes an EL layer between a first electrode and a second electrode. The first electrode is separated between light-emitting elements. The EL layer includes a layer containing a light-emitting substance and a layer having high conductivity provided between the first electrode and the layer containing a light-emitting substance. Accordingly, a light-emitting device including a light-emitting element with low driving voltage and thus having low power consumption can be achieved.

In addition, the light-emitting device in this embodiment includes an inversely tapered partition only between adjacent light-emitting units emitting light of different colors. Thus, even in a structure in which the EL layer includes a layer having high conductivity, it is possible to prevent current flow from one light-emitting element in an emission state to the other light-emitting element in a non-emission state between adjacent light-emitting units emitting light of different colors. Consequently, unintentional light emission of a light-emitting unit in a non-emission state can be prevented, so that a light-emitting device capable of emitting light of a bright color can be provided.

The inversely tapered partition is not provided between adjacent light-emitting units emitting light of the same color. Further, a common wiring electrically connected to the second electrode is provided. Thus, an increase in resistance of the second electrode can be suppressed. This structure can suppress a potential drop of the second electrode, thereby achieving a high-quality light-emitting device with less luminance unevenness.

An active matrix light-emitting device according to one embodiment of the present invention includes, over a substrate 801, the light-emitting portion 802, a driver circuit portion 803 (gate side driver circuit portion), a driver circuit portion 804 (source side drive circuit portion), a contact portion 807, and a fixing portion 805. The light-emitting portion 802, the driver circuit portions 803 and 804, and the contact portion 807 are sealed in a space surrounded by the substrate 801, a substrate 806, and the fixing portion 805.

Note that the light-emitting portion 802 and the contact portion 807 in the light-emitting device in this embodiment include the structure illustrated in FIG. 4C.

Over the substrate 801, a lead wiring for connecting an external input terminal through which a signal (e.g., a video signal, a clock signal, a start signal, a reset signal, or the like) or a potential from the outside is transmitted to the driver circuit portions 803 and 804 is provided. Here, an example is described in which a flexible printed circuit (FPC) 808 is provided as the external input terminal. Note that a printed wiring board (PWB) may be attached to the FPC 808. In this specification, the light-emitting device includes in its category the light-emitting device itself and the light-emitting device on which the FPC or the PWB is mounted.

The driver circuit portions 803 and 804 include a plurality of transistors. FIGS. 5A and 5B each illustrate an example in which the driver circuit portion 803 includes a CMOS circuit which is a combination of an n-channel transistor 152 and a p-channel transistor 153. A circuit included in the driver circuit portion can be formed using various types of circuits such as a CMOS circuit, a PMOS circuit, or an NMOS circuit. In this embodiment, a driver-integrated type in which a driver circuit and the light-emitting portion are formed over the same substrate is described; however, the present invention is not limited to this structure, and a driver circuit can be faulted over a substrate that is different from the substrate over which a light-emitting portion is formed.

The light-emitting portion 802 includes a plurality of light-emitting units each including a switching transistor, a current control transistor 140, and the first electrode 118 electrically connected to a wiring (a source electrode or a drain electrode) of the current control transistor 140. Further, the insulating layer 124 is formed so as to cover an end portion of the first electrode 118. The partition 150 described in Embodiment 1 is provided over the insulating layer 124.

The light-emitting element 130 includes the first electrode 118, the layer containing an organic compound (EL layer) 120, and the second electrode 122.

In the contact portion 807, the second electrode 122 is electrically connected to the common wiring 170. This embodiment shows an example in which the common wiring 170 is formed in the same step as the first electrode 118 (formed using the same material as the first electrode 118), but a material of the common wiring 170 is not limited thereto. For example, the common wiring 170 may be formed using the same material as a conductive layer included in the transistors 140, 152, and 153.

<Material>

Examples of materials that can be used for the light-emitting device according to one embodiment of the present invention will be described below.

[Substrates 801 and 806]

For each of the substrates, a material such as glass, quartz, or an organic resin can be used. The substrate on the side from which light from the EL element 130 is extracted is formed using a material which transmits the light.

In the case where an organic resin is used for the substrate, any of the following can be used as the organic resin, for example: polyester resins such as polyethylene terephthalate (PET) and polyethylene naphthalate (PEN), a polyacrylonitrile resin, a polyimide resin, a polymethylmethacrylate resin, a polycarbonate (PC) resin, a polyethersulfone (PES) resin, a polyamide resin, a cycloolefin resin, a polystyrene resin, a polyamide imide resin, a polyvinylchloride resin, and the like. Further, a substrate in which a glass fiber is impregnated with an organic resin or a substrate in which an inorganic filler is mixed with an organic resin can also be used.

Note that the insulating layer 104 is provided on a surface of the substrate 801 in order to prevent impurities contained in the substrate 801 from diffusing into elements provided over the substrate 801.

[Transistor]

There is no particular limitation on the structure of the transistor (e.g., the transistors 140, 152, and 153) used in the light-emitting device according to one embodiment of the present invention. A top-gate transistor may be used, or a bottom-gate transistor such as inverted staggered transistor may be used. In addition, there is no particular limitation on a material used for the transistor.

A gate electrode 106 can be formed using a single layer or stacked layers of a metal material such as molybdenum, titanium, chromium, tantalum, tungsten, aluminum, copper, neodymium, or scandium, or an alloy material which contains any of these elements, for example.

A gate insulating layer 108 can be formed using a single layer or stacked layers of silicon oxide, silicon nitride, silicon oxynitride, silicon nitride oxide, or aluminum oxide by a plasma CVD method, a sputtering method, or the like, for example.

A semiconductor layer 110 can be formed using silicon or an oxide semiconductor. As silicon, single crystal silicon, polycrystalline silicon, or the like can be used as appropriate. As an oxide semiconductor, an In—Ga—Zn—O-based metal oxide or the like can be used as appropriate. Note that the semiconductor layer 110 is preferably formed using an oxide semiconductor which is an In—Ga—Zn—O-based metal oxide so as to have low off-state current, in which case an off-state leakage current of the light-emitting element 130 to be formed later can be reduced.

A source electrode layer 112a and a drain electrode layer 112b can be formed using a metal film containing an element selected from Al, Cr, Cu, Ta, Ti, Mo, and W, a metal nitride film containing any of these elements (a titanium nitride film, a molybdenum nitride film, or a tungsten nitride film), or the like, for example. Alternatively, a film of a high-melting-point metal such as Ti, Mo, or W or a metal nitride film thereof (e.g., a titanium nitride film, a molybdenum nitride film, or a tungsten nitride film) may be formed over or/and below a metal film such as an Al film or a Cu film. Further alternatively, the source electrode layer 112a and the drain electrode layer 112b may be formed using a conductive metal oxide. As the conductive metal oxide, indium oxide ($In_2O_3$ or the like), tin oxide ($SnO_2$ or the like), zinc oxide (ZnO), ITO, indium oxide-zinc oxide ($In_2O_3$—ZnO or the like), or any of these metal oxide materials in which silicon oxide is contained can be used.

A first insulating layer 114 has an effect of preventing diffusion of impurities into a semiconductor included in the transistor. As the first insulating layer 114, typically, an inorganic insulating film such as a silicon oxide film, a silicon oxynitride film, or an aluminum oxide film can be used.

As a second insulating layer 116, an insulating film with a planarization function is preferably selected in order to reduce surface unevenness due to the transistor. For example, an organic material such as polyimide, acrylic, or benzocyclobutene can be used. Other than such organic materials, it is also possible to use a low-dielectric constant material (low-k material) or the like. Note that the second insulating layer 116 may be formed by stacking a plurality of insulating films formed using any of these materials.

[Insulating Layer 124]

The insulating layer 124 is formed so as to cover an end portion of the first electrode 118. The insulating layer 124 preferably has a curved surface with curvature at an upper end portion or a lower end portion thereof in order to obtain favorable coverage by the second electrode 122 which is to be formed over the insulating layer 124. For example, it is preferable that the upper end portion or the lower end portion of the insulating layer 124 have a curved surface with a radius of curvature (0.2 μm to 3 μm). The insulating layer 124 can be formed using an organic compound such as a negative photosensitive resin or a positive photosensitive resin, or an inorganic compound such as silicon oxide or silicon oxynitride. It is preferable to form the insulating layer 124 using a light-shielding material, because light emitted from a light-emitting element can be prevented from leaking into an adjacent light-emitting unit.

[Light-Emitting Element]

The first electrode 118 is provided on the side opposite to a side where light is extracted and is formed using a reflective material. As the reflective material, a metal material such as aluminum, gold, platinum, silver, nickel, tungsten, chromium, molybdenum, iron, cobalt, copper, or palladium can be used. Besides, an alloy containing aluminum (an aluminum alloy) such as an alloy of aluminum and titanium, an alloy of aluminum and nickel, or an alloy of aluminum and neodymium, or an alloy containing silver such as an alloy of silver and copper can be used. An alloy of silver and copper is preferable because of its high heat resistance.

The EL layer 120 includes at least a layer (light-emitting layer) containing a light-emitting substance and a layer having high conductivity provided between the first electrode and the light-emitting layer. In addition, the EL layer 120 can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate. Structural examples of the EL layer will be described in detail in Embodiment 4.

As a light-transmitting material for the second electrode 122, indium oxide, indium tin oxide (ITO), indium zinc oxide, zinc oxide, zinc oxide to which gallium is added, or the like can be used.

In addition, for the second electrode 122, a metal material such as gold, platinum, nickel, tungsten, chromium, molybdenum, iron, cobalt, copper, palladium, or titanium can be used. A nitride of the metal material (e.g., titanium nitride) or the like may also be used. Graphene or the like may also be used. In the case of using the metal material (or the nitride thereof), the second electrode 122 may be thinned so as to be able to transmit light.

In this embodiment, the light-emitting device having a top emission structure is described; however, the light-emitting device may have a bottom emission structure or a dual emission structure.

[Color Filter and Black Matrix]

On the substrate 806, a color filter 166 is provided to overlap with the light-emitting element 130. The color filter 166 is provided in order to control the color of light emitted from the light-emitting element 130. For example, in a full-color display device using white light-emitting elements, a plurality of light-emitting units provided with color filters of different colors are used. In that case, three colors, red (R), green (G), and blue (B), may be used, or four colors, red (R), green (G), blue (B), and yellow (Y), may be used.

A black matrix 164 is provided between the adjacent color filters 166. The black matrix 164 shields a light-emitting unit from light emitted from the light-emitting elements 130 in adjacent light-emitting units and prevents color mixture between the adjacent light-emitting units. Here, the color filter 166 is provided so that its end portions overlap with the black matrix 164, whereby light leakage can be reduced. The black matrix 164 can be formed using a material that shields light emitted from the light-emitting element 130, for example, a metal or an organic resin. Note that the black matrix 164 may be provided in a region other than the light-emitting portion 802, for example, in the driver circuit portion 803.

An overcoat 168 is formed to cover the color filter 166 and the black matrix 164. The overcoat 168 is formed using a material that transmits light emitted from the light-emitting element 130, and can be an inorganic insulating film or an organic insulating film, for example. Note that the overcoat 168 is not necessarily provided unless needed.

[Fixing Portion 805]

The substrates 801 and 806 are attached to each other with a sealant or the like at the fixing portion 805. As the sealant, an organic resin such as a thermosetting resin or a photocurable resin, glass frit including low-melting glass, or the like can be used. Note that a drying agent may be contained in the sealant. For example, a substance which absorbs moisture by chemical adsorption, such as an oxide of an alkaline earth metal (e.g., calcium oxide or barium oxide), can be used. Alternatively, a substance which adsorbs moisture by physical adsorption, such as zeolite or silica gel, may be used as the drying agent. The sealant preferably contains a drying agent because impurities such as moisture in the sealed region can be reduced and the reliability of the light-emitting element 130 can be increased.

The light-emitting element 130 is provided in a sealed region 169 surrounded by the substrate 801, the substrate 806, and the sealant. The sealed region 169 may be filled with an inert gas such as a rare gas or a nitrogen gas or a solid such as organic resin, or may be in a reduced pressure atmosphere. The amount of impurities such as water and oxygen in the sealed region 169 is preferably small even if the sealed region 169 is filled with a gas or a solid or is in a reduced pressure atmosphere, because the reliability of the light-emitting element is increased.

The partition can also function as a spacer. For example, the structure illustrated in FIG. 5B can be employed, in which a partition 151 is in contact with the substrate 806 with the overcoat 168, the black matrix 164, and the like provided therebetween.

In this embodiment, a light-emitting device using a color filter method is described as an example, but one embodiment of the present invention is not limited thereto. For example, a separate coloring method or a color conversion method may be used.

This embodiment can be combined with any of the other embodiments as appropriate.

Embodiment 4

In this embodiment, structural examples of an EL layer which can be used for a light-emitting device according to one embodiment of the present invention are described with reference to FIGS. 6A to 6C.

In one embodiment of the present invention, an EL layer includes a layer (light-emitting layer) containing a light-emitting substance and a layer having high conductivity. Accordingly, a light-emitting element having low driving voltage or a light-emitting device with low power consumption can be achieved in one embodiment of the present invention.

A known substance can be used for the EL layer, and either a low molecular compound or a high molecular compound can be used. Note that the substance for forming the EL layer includes not only an organic compound but also an inorganic compound in part thereof.

Figure 6A:
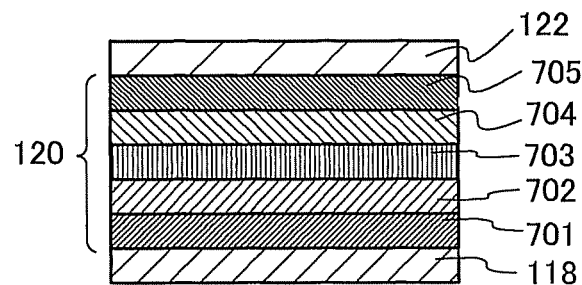
FIGS. 6A to 6C illustrate examples of an EL layer of one embodiment of the present invention.

In FIG. 6A, the EL layer 120 is provided between the first electrode 118 and the second electrode 122. The EL layer 120 includes a light-emitting layer 703 and a layer having high conductivity provided between the first electrode 118 and the light-emitting layer 703.

In the EL layer 120 in FIG. 6A, a hole-injection layer 701, a hole-transport layer 702, a light-emitting layer 703, an electron-transport layer 704, and an electron-injection layer 705 are stacked in this order from the first electrode 118 side. For example, a conductive polymer such as poly(3,4-ethylenedioxythiophene)/poly(styrenesulfonic acid) (PEDOT/PSS) can be used for the hole-injection layer 701, so that the hole-injection layer 701 can have high conductivity.

Figure 6B:
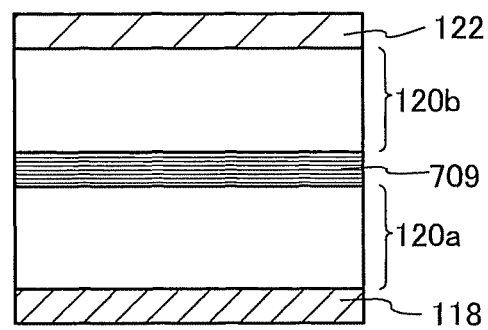

A plurality of EL layers may be stacked between the first electrode 118 and the second electrode 122 as illustrated in FIG. 6B. In that case, a charge generation layer 709 is preferably provided between a first EL layer 120a and a second EL layer 120b which are stacked. A light-emitting element having such a structure is unlikely to suffer the problem of energy transfer, quenching, or the like and gives wider choice of materials, thereby easily having both high light emission efficiency and a long lifetime. Moreover, it is easy to obtain phosphorescence from one EL layer and fluorescence from the other EL layer. This structure can be combined with the above-mentioned structure of the EL layer.

By making the EL layers emit light of different colors from each other, the light-emitting element can provide light emission of a desired color as a whole. For example, by forming a light-emitting element having two EL layers such that the emission color of the first EL layer and the emission color of the second EL layer are complementary colors, the light-emitting element can provide white light emission as a whole. Note that the word "complementary" means color relationship in which an achromatic color is obtained when colors are mixed. In other words, when lights obtained from substances which emit light of complementary colors are mixed, white emission can be obtained. This can be applied to a light-emitting element including three or more EL layers.

Figure 6C:
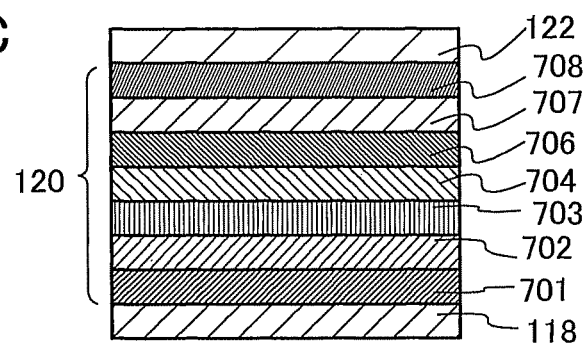

As illustrated in FIG. 6C, the EL layer 120 may include the hole-injection layer 701, the hole-transport layer 702, the light-emitting layer 703, the electron-transport layer 704, an electron-injection buffer layer 706, an electron-relay layer 707, and a composite material layer 708 which is in contact with the second electrode 122, between the first electrode 118 and the second electrode 122.

It is preferable to provide the composite material layer 708 which is in contact with the second electrode 122 because damage caused to the EL layer 120 particularly when the second electrode 122 is formed by a sputtering method can be reduced.

By providing the electron-injection buffer layer 706, an injection barrier between the composite material layer 708 and the electron-transport layer 704 can be reduced; thus, electrons generated in the composite material layer 708 can be easily injected to the electron-transport layer 704.

The electron-relay layer 707 is preferably formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

In the structure in which the electron-relay layer 707 is sandwiched between the composite material layer 708 and the electron-injection buffer layer 706, the acceptor substance contained in the composite material layer 708 and the donor substance contained in the electron-injection buffer layer 706 are less likely to interact with each other, and thus their functions hardly interfere with each other. Accordingly, an increase in driving voltage can be suppressed.

For example, a layer which contains a donor substance and an acceptor substance (specifically, a layer in which an alkali metal, an alkaline earth metal, a rare earth metal, an alkali metal compound, an alkaline earth metal compound, or a rare earth metal compound is added to an organic compound) can be used for the electron-injection buffer layer 706, so that the electron-injection buffer layer 706 can have high conductivity.

Examples of materials which can be used for each layer will be described below.

The hole-injection layer 701 is a layer containing a substance having a high hole-injection property. As the substance having a high hole-injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. A phthalocyanine-based compound such as phthalocyanine (abbreviation: $H_2Pc$), or copper(II) phthalocyanine (abbreviation: CuPc) can also be used.

Further, any of the following aromatic amine compounds which are low molecular organic compounds can be used: 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Any of high molecular compounds (e.g., oligomers, dendrimers, or polymers) can also be used. Examples of the high molecular compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD). A high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), may be used.

In particular, for the hole-injection layer 701, a composite material in which an acceptor substance is mixed with an organic compound having a high hole-transport property is preferably used. With the use of the composite material in which an acceptor substance is mixed with a substance having a high hole-transport property, excellent hole-injection from the first electrode 118 can be obtained, which results in a reduction in driving voltage of the light-emitting element. Such a composite material can be formed by co-evaporation of a substance having a high hole-transport property and an acceptor substance. When the hole-injection layer 701 is formed using the composite material, holes are easily injected from the first electrode 118 into the EL layer 120.

As the organic compound for the composite material, any of a variety of compounds such as an aromatic amine compound, a carbazole derivative, aromatic hydrocarbon, and a high molecular compound (such as oligomer, dendrimer, or polymer) can be used. The organic compound used for the composite material is preferably an organic compound having a high hole-transport property. Specifically, a substance having a hole mobility of $10^{-6}$ cm$^2$/Vs or higher is preferably used. Note that other than the above substances, any substance that has a property of transporting more holes than electrons may be used. The organic compounds which can be used for the composite material will be specifically shown below.

Examples of the organic compound that can be used for the composite material are aromatic amine compounds, such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP), and carbazole derivatives, such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

Other examples of the organic compound that can be used are aromatic hydrocarbon compounds, such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene.

Other examples of the organic compound that can be used are aromatic hydrocarbon compounds, such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), and 9,10-bis[4-(2,2-diphenylvinyl)phenyl]anthracene (abbreviation: DPVPA).

Further, examples of the electron acceptor are organic compounds, such as 7,7,8,8-tetracyano-2,3,5,6-tetrafluoro-quinodimethane (abbreviation: $F_4$-TCNQ) and chloranil, oxides of transition metals, and oxides of metals that belong to Groups 4 to 8 in the periodic table. Specifically, vanadium oxide, niobium oxide, tantalum oxide, chromium oxide, molybdenum oxide, tungsten oxide, manganese oxide, and rhenium oxide are preferable because of their high electron accepting properties. Among these, molybdenum oxide is especially preferable because it is stable in the air, has a low hygroscopic property, and is easily handled.

The composite material may be formed using the above-described electron acceptor and the above-described high molecular compound such as PVK, PVTPA, PTPDMA, or Poly-TPD and used for the hole-injection layer 701.

The hole-transport layer 702 is a layer containing a substance having a high hole-transport property. As the substance having a high hole-transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances mentioned here are mainly ones that have a hole mobility of $10^{-6}$ cm$^2$/Vs or higher. Note that other than the above substances, any substance that has a property of transporting more holes than electrons may be used. The layer containing a substance having a high hole-transport property is not limited to a single layer, and may be a stack of two or more layers containing any of the above substances.

For the hole-transport layer 702, a carbazole derivative such as CBP, CzPA, or PCzPA or an anthracene derivative such as t-BuDNA, DNA, or DPAnth may be used.

For the hole-transport layer 702, a high molecular compound such as PVK, PVTPA, PTPDMA, or Poly-TPD can also be used.

For the light-emitting layer 703, a fluorescent compound which exhibits fluorescence or a phosphorescent compound which exhibits phosphorescence can be used.

Examples of the fluorescent compound that can be used for the light-emitting layer 703 are the following light-emitting materials: materials that emit blue light, such as N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl)triphenylamine (abbreviation: PCBAPA); materials that emit green light, such as N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA); materials that emit yellow light, such as rubrene and 5,12-bis(1,1'-biphenyl-4-yl)-6,11-diphenyltetracene (abbreviation: BPT); and materials that emit red light, such as N,N,N',N'-tetrakis(4-methylphenyl)tetracene-5,11-diamine (abbreviation: p-mPhTD) and 7,14-diphenyl-N,N,N',N'-tetrakis(4-methylphenyl)acenaphtho[1,2-a]fluoranthene-3,10-diamine (abbreviation: p-mPhAFD).

Examples of the phosphorescent compound that can be used for the light-emitting layer 703 are the following light-emitting materials: materials that emit blue light, such as bis[2-(4',6'-difluorophenyl)pyridinato-N,C$^{2'}$]iridium(III)tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis{2-[3',5'-bis(trifluoromethyl)phenyl]pyridinato-N,C$^{2'}$}iridium(III)picolinate (abbreviation: Ir(CF$_3$ppy)$_2$(pic)), and bis[2-(4',6'-difluorophenyl)pyridinato-N,C$^{2'}$]iridium(III)acetylacetonate (abbreviation: FIr(acac)); materials that emit green light, such as tris(2-phenylpyridinato-N,C$^{2'}$)iridium(III) (abbreviation: Ir(ppy)$_3$), bis(2-phenylpyridinato-N,C$^{2'}$)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), and tris(benzo[h]quinolinato)iridium(III) (abbreviation: Ir(bzq)$_3$); materials that emit yellow light, such as bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac), and (acetylacetonato)bis[2-(4-methoxyphenyl)-3,5-dimethylpyrazinato]iridium(III) (abbreviation: Ir(dmmoppr)$_2$(acac)); materials that emit orange light, such as tris(2-phenylquinolinato-N,C$^{2'}$)iridium(III) (abbreviation: Ir(pq)$_3$), bis(2-phenylquinolinato-N,C$^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), and (acetylacetonato)bis(5-isopropyl-3-methyl-2-phenylpyrazinato)iridium(III) (abbreviation: Ir(mppr-iPr)$_2$(acac)); and materials, that emit red light, for example, organometallic complexes, such as bis[2-(2'-benzo[4,5-α]thienyl)pyridinato-N,C$^{3'}$)iridium(III) acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium (III) (abbreviation: Ir(tppr)$_2$(dpm)), and (2,3,7,8,12,13,17,18-octaethyl-21H,23H-porphyrin)platinum(II) (abbreviation: PtOEP). Further, rare-earth metal complexes, such as tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), and tris[1-(2-thenyl)-3,3,3-trifluoroacetonato](monophenanthroline)europium(III) (abbreviation: Eu(TTA)$_3$(Phen)), exhibit light emission from rare-earth metal ions (electron transition between different multiplicities), and thus can be used as phosphorescent compounds.

Note that the light-emitting layer 703 may have a structure in which any of the above-described light-emitting organic compounds (a guest material) is dispersed in another substance (a host material). As the host material, various kinds of materials can be used, and it is preferable to use a substance which has a lowest unoccupied molecular orbital level (LUMO level) higher than that of the light-emitting substance and has a highest occupied molecular orbital level (HOMO level) lower than that of the light-emitting substance.

Specific examples of the host material that can be used are the following materials: metal complexes, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds, such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), and bathocuproine (abbreviation: BCP); condensed aromatic compounds, such as CzPA, DNA, DPPA, t-BuDNA, DPAnth, 3,6-diphenyl-9-[4-(10-phenyl-9-anthryl)phenyl]-9H-carbazole (abbreviation: DPCzPA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), and 6,12-dimethoxy-5,11-diphenylchrysene; aromatic amine compounds, such as N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), 2PCAPA, NPB (or α-NPD), TPD, DFLDPBi, and BSPB; and the like.

Alternatively, plural kinds of materials can be used as the host material. For example, in order to suppress crystallization, a substance such as rubrene which suppresses crystallization may be further added. In addition, NPB, Alq, or the like may be further added in order to efficiently transfer energy to the guest material.

With a structure in which a guest material is dispersed in a host material, crystallization of the light-emitting layer 703 can be suppressed. Further, concentration quenching due to high concentration of the guest material can be suppressed.

For the light-emitting layer 703, a high molecular compound can be used. Specific examples of materials that emit blue light are poly(9,9-dioctylfluorene-2,7-diyl) (abbreviation: PFO), poly[(9,9-dioctylfluorene-2,7-diyl)-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH), and the like. Specific examples of materials that emit green light are poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), poly[(9,9-dioctyl-2,7-divinylenefluorenylene)-alt-co-(2-methoxy-5-(2-ethylhexyloxy)-1,4-phenylene)], and the like. Specific examples of materials that emit orange to red light are poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenylamino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD), and the like.

By providing a plurality of light-emitting layers and making the emission colors of the layers different from each other, light emission of a desired color can be obtained from the light-emitting element as a whole. For example, by forming a light-emitting element having two light-emitting layers such that the emission color of the first light-emitting layer and the emission color of the second light-emitting layer are complementary colors, the light-emitting element can provide white light emission as a whole. This can be applied to a light-emitting element having three or more light-emitting layers.

The electron-transport layer 704 is a layer containing a substance having a high electron-transport property. As the substance having a high electron-transport property, for example, a metal complex having a quinoline skeleton or a benzoquinoline skeleton, such as Alq, Almq$_3$, BeBq$_2$, or Balq can be used. Alternatively, it is possible to use a metal complex having an oxazole-based ligand or a thiazole-based ligand, such as ZnPBO or ZnBTZ. Further alternatively, instead of a metal complex, it is possible to use PBD, OXD-7, TAZ, Bphen, BCP, or the like. The substances mentioned here are mainly ones that have an electron mobility of $10^{-6}$ cm$^2$/Vs or higher. The electron-transport layer is not limited to a single layer, and may be a stack of two or more layers containing any of the above substances.

The electron-injection layer 705 is a layer containing a substance having a high electron-injection property. For the electron-injection layer 705, an alkali metal, an alkaline earth metal, or a compound thereof, such as lithium, cesium, calcium, lithium fluoride, cesium fluoride, calcium fluoride, or lithium oxide, can be used. A rare earth metal compound such as erbium fluoride can also be used. Any of the above substances for forming the electron-transport layer 704 can also be used.

Note that the hole-injection layer 701, the hole-transport layer 702, the light-emitting layer 703, the electron-transport layer 704, and the electron-injection layer 705 which are described above can each be formed by a method such as an evaporation method (e.g., a vacuum evaporation method), an inkjet method, or a coating method.

The charge generation layer 709 illustrated in FIG. 6B can be formed using the above-mentioned composite material. Further, the charge generation layer 709 may have a stacked-layer structure including a layer containing the composite material and a layer containing another material. In that case, as the layer containing another material, a layer containing an electron donating substance and a substance having a high electron-transport property, a layer formed using a transparent conductive film, or the like can be used.

The composite material layer 708 illustrated in FIG. 6C can be formed using the above-described composite material in which an acceptor substance is mixed with an organic compound having a high hole-transport property.

For the electron-injection buffer layer 706, a substance having a high electron-injection property, such as an alkali metal, an alkaline earth metal, a rare earth metal, or a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)), can be used.

Further, in the case where the electron-injection buffer layer 706 contains a substance having a high electron-transport property and a donor substance, the donor substance is preferably added so that the mass ratio of the donor substance to the substance having a high electron-transport property is in the range from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, and a compound, of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). Note that as the substance having a high electron-transport property, a material similar to the material for the electron-transport layer 704 described above can be used.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be located between the LUMO level of the acceptor substance contained in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably higher than or equal to −5.0 eV, more preferably higher than or equal to −5.0 eV and lower than or equal to −3.0 eV.

As the substance having a high electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, specifically, any of CuPc, a phthalocyanine tin(II) complex (SnPc), a phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc), is preferably used.

As the metal complex having a metal-oxygen bond and an aromatic ligand, which is contained in the electron-relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex having a metal-oxygen double bond is considered stable. Thus, the use of the metal complex having a metal-oxygen double bond makes it possible to drive the light-emitting element at low voltage more stably.

As a metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that as the phthalocyanine-based material described above, a phthalocyanine-based material having a phenoxy group is preferable. Specifically, a phthalocyanine derivative having a phenoxy group, such as PhO-VOPc, is preferable. The phthalocyanine derivative having a phenoxy group is soluble in a solvent and therefore has the advantage of being easy to handle during formation of a light-emitting element and the advantage of facilitating maintenance of an apparatus used for film formation.

The electron-relay layer 707 may further contain a donor substance. As the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the electron-relay layer 707, electrons can be transferred easily and the light-emitting element can be driven at lower voltage.

In the case where a donor substance is contained in the electron-relay layer 707, in addition to the materials described above, a substance having a LUMO level higher than the acceptor level of the acceptor substance contained in the composite material layer 708 can be used as the substance having a high electron-transport property. Specifically, it is preferable to use a substance having a LUMO level higher than or equal to −5.0 eV, preferably higher than or equal to −5.0 eV and lower than or equal to −3.0 eV. Examples of such a substance are a perylene derivative and a nitrogen-containing condensed aromatic compound. Note that a nitrogen-containing condensed aromatic compound is preferably used for the electron-relay layer 707 because of its stability.

Specific examples of the perylene derivative are 3,4,9,10-perylenetetracarboxylic dianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (abbreviation: Hex PTC), and the like.

Specific examples of the nitrogen-containing condensed aromatic compound are pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Besides, 7,7,8,8-tetracyanoquinodimethane (abbreviation: TCNQ), 1,4,5,8-naphthalenetetracarboxylic dianhydride (abbreviation: NTCDA), perfluoropentacene, copper hexadecafluorophthalocyanine (abbreviation: F$_{16}$CuPc), N,N'-bis(2,2,3,3,4,4,5,5,6,6,7,7,8,8,8-pentadecafluorooctyl)-1,4,5,8-naphthalenetetracarboxylicdiimide (abbreviation: NTCDI-C8F), 3',4'-dibutyl-5,5''-bis(dicyanomethylene)-5,5''-dihydro-2,2':5',2''-terthiophene (abbreviation: DCMT), methanofullerenes (e.g., [6,6]-phenyl C$_{61}$ butyric acid methyl ester), or the like can be used.

Note that in the case where a donor substance is contained in the electron-relay layer 707, the electron-relay layer 707 may be formed by a method such as co-evaporation of the substance having a high electron-transport property and the donor substance.

In the above manner, the EL layer in this embodiment can be formed.

This embodiment can be freely combined with any of the other embodiments.

Embodiment 5

In this embodiment, with reference to FIGS. 7A to 7E and FIG. 8, description is given of examples of a variety of electronic devices and lighting devices that are each completed by use of a light-emitting device according to one embodiment of the present invention.

Examples of the electronic devices to which the light-emitting device is applied are a television device (also referred to as television or television receiver), a monitor of a computer or the like, a camera such as a digital camera or a digital video camera, a digital photo frame, a mobile phone (also referred to as cellular phone or cellular phone device), a portable game machine, a portable information terminal, an audio reproducing device, and a large-sized game machine such as a pachinko machine. Specific examples of these electronic devices and a lighting device are illustrated in FIGS. 7A to 7E.

FIG. 7A illustrates an example of a television device. In a television device 7100, a display portion 7103 is incorporated in a housing 7101. The display portion 7103 is capable of displaying images, and the light-emitting device can be used for the display portion 7103. Here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the receiver, a general television broadcast can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

FIG. 7B illustrates a computer having a main body 7201, a housing 7202, a display portion 7203, a keyboard 7204, an external connection port 7205, a pointing device 7206, and the like. Note that this computer is manufactured using the light-emitting device for the display portion 7203.

FIG. 7C illustrates a portable game machine having two housings, a housing 7301 and a housing 7302, which are connected with a joint portion 7303 so that the portable game machine can be opened or folded. A display portion 7304 is incorporated in the housing 7301, and a display portion 7305 is incorporated in the housing 7302. In addition, the portable game machine illustrated in FIG. 7C includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as long as the light-emitting device is used for at least one of the display portion 7304 and the display portion 7305, and may include other accessories as appropriate. The portable game machine illustrated in FIG. 7C has a function of reading out a program or data stored in a storage medium to display it on the display portion, and a function of sharing information with another portable game machine by wireless communication. The portable game machine illustrated in FIG. 7C can have a variety of functions without limitation to the above.

FIG. 7D illustrates an example of a mobile phone. A mobile phone 7400 is provided with a display portion 7402 incorporated in a housing 7401, operation buttons 7403, an external connection port 7404, a speaker 7405, a microphone 7406, and the like. Note that the mobile phone 7400 is manufactured using the light-emitting device for the display portion 7402.

When the display portion 7402 of the mobile phone 7400 illustrated in FIG. 7D is touched with a finger or the like, data can be input into the mobile phone 7400. Further, operations such as making a call and composing an e-mail can be performed by touching the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on the screen can be inputted. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically switched by determining the orientation of the mobile phone 7400 (whether the mobile phone is placed horizontally or vertically for a landscape mode or a portrait mode).

The screen modes are switched by touching the display portion 7402, or operating the operation buttons 7403 of the housing 7401. The screen modes can also be switched depending on the kind of image displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken when the display portion 7402 is touched with the palm or the finger, whereby personal authentication can be performed. Further, by providing a backlight or a sensing light source which emits near-infrared light in the display portion, an image of a finger vein, a palm vein, or the like can be taken.

FIG. 7E illustrates a desk lamp, which includes a lighting portion 7501, a shade 7502, an adjustable arm 7503, a support 7504, a base 7505, and a power switch 7506. The desk lamp is manufactured using the light-emitting device for the lighting portion 7501. Note that the "lighting device" also includes ceiling lights, wall lights, and the like.

Figure 8:
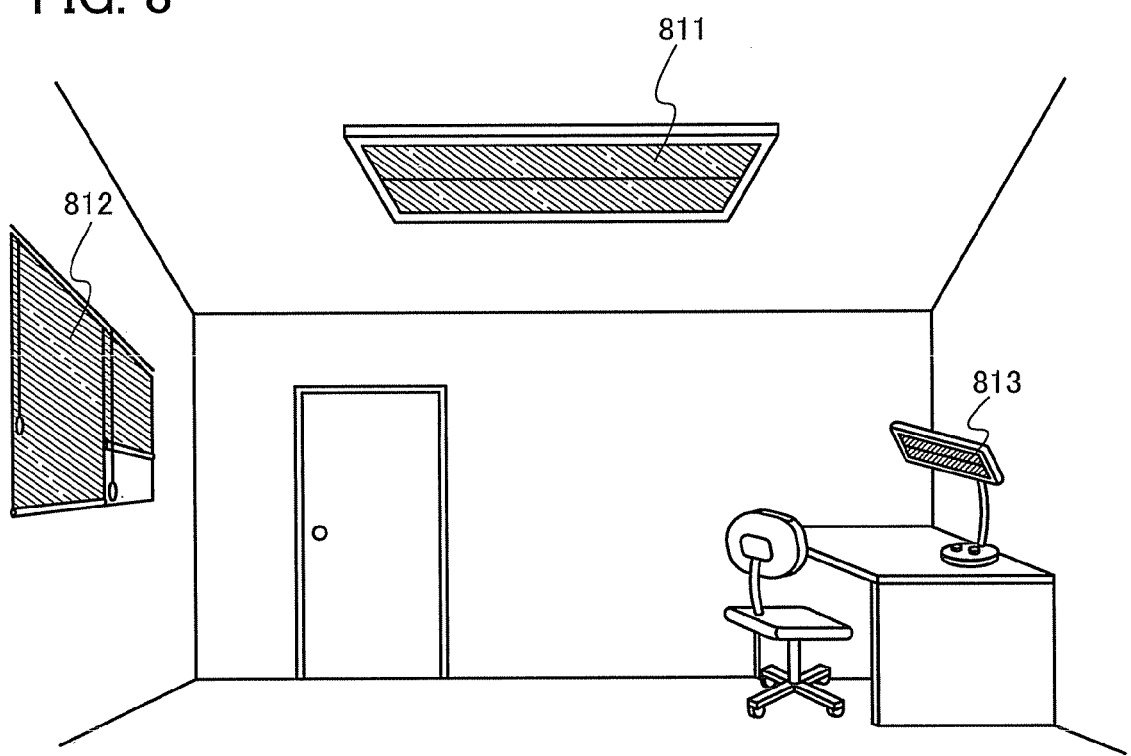
FIG. 8 illustrates an example of a lighting device of one embodiment of the present invention.

FIG. 8 illustrates an example in which the light-emitting device is used for an interior lighting device 811. Since the light-emitting device can have a larger area, it can be used as a large-area lighting device. Furthermore, the light-emitting device can be used as a roll-type lighting device 812. As illustrated in FIG. 8, a desk lamp 813 described with reference to FIG. 7E may also be used in a room provided with the interior lighting device 811.

As described above, electronic devices and lighting devices can be obtained by application of the light-emitting device. The light-emitting device has a remarkably wide application range, and can be applied to electronic devices in a variety of fields.

Note that the structure described in this embodiment can be combined with the structure described in any of the above embodiments as appropriate.

Example 1

In this example, an image display device to which one embodiment of the present invention is applied is described with reference to FIG. 10, FIGS. 11A and 11B, and FIG. 12. Note that the positional relation between an upper surface shape of a partition and a light-emitting unit in the image display device in this example corresponds to that in FIG. 1A.

<Method for Manufacturing Image Display Device in this Example>

First, as substrate heat treatment, a glass substrate 200 (AN100, manufactured by Asahi Glass Co., Ltd.) was heated at 650° C.

Next, a base layer 204 was formed over the glass substrate 200. The base layer 204 is a multi-layer film in which a 100-nm-thick silicon nitride film and a 150-nm-thick silicon oxynitride film, which are formed by CVD, are stacked.

Then, a gate electrode 206 was formed over the base layer 204. The gate electrode 206 is a multi-layer film in which a 30-nm-thick tantalum nitride film, a 200-nm-thick copper film, and a 30-nm-thick tungsten film, which are formed by sputtering, are stacked.

Then, a gate insulating layer 208 was formed over the gate electrode 206. The gate insulating layer 208 is a multi-layer film in which a 50-nm-thick silicon nitride film and a 270-nm-thick silicon oxynitride film, which are formed by CVD, are stacked.

Then, a semiconductor layer 210 was formed over the gate insulating layer 208. As the semiconductor layer 210, a 35-nm-thick In—Ga—Zn-based oxide film formed by sputtering was used. The In—Ga—Zn-based oxide film was formed using an In—Ga—Zn-based oxide target with an atomic ratio of In:Ga:Zn=1:1:1. The deposition condition was as follows: the atmosphere was oxygen and argon (the flow rate of oxygen: 50%), the pressure was 0.6 Pa, the electric power was 5 kW, and the substrate temperature was 200° C.

After the formation of the semiconductor layer 210, heat treatment was performed at 450° C. for one hour in a nitrogen atmosphere, and then, heat treatment was performed at 450° C. for one hour in an atmosphere containing nitrogen and oxygen (the flow rate of oxygen: 50%).

Next, a source electrode 212a and a drain electrode 212b were formed. The source electrode 212a and the drain electrode 212b are each a multi-layer film in which a 50-nm-thick tungsten film, a 400-nm-thick aluminum film, and a 100-nm-thick titanium film, which are formed by sputtering, are stacked.

After the formation of the source electrode 212a and the drain electrode 212b, heat treatment was performed at 300° C. for one hour in an oxygen atmosphere.

Next, a first interlayer insulating layer 213, which is a multi-layer film in which a 400-nm-thick silicon oxide film formed by sputtering and a 200-nm-thick silicon nitride oxide film formed by CVD are stacked, was provided, and heat treatment was performed at 300° C. for one hour in an oxygen atmosphere.

Then, a second interlayer insulating layer 214, which is a 1.5-μm-thick polyimide film formed with a spin coater, was formed, and heat treatment was performed at 300° C. for one hour in an oxygen atmosphere.

Next, a conductive layer 215 was formed over the second interlayer insulating layer 214. The conductive layer 215 is a multi-layer film in which a 100-nm-thick titanium film, a 400-nm-thick aluminum film, and a 100-nm-thick titanium film, which are formed by sputtering, are stacked.

Then, a third interlayer insulating film 216, which is a 1.5-μm-thick polyimide film formed with a spin coater, was formed, and heat treatment was performed at 270° C. for one hour in an oxygen atmosphere.

Then, a first electrode 218 of a light-emitting element was formed over the third interlayer insulating film 216. The first electrode 218 is a multi-layer film in which a 50-nm-thick titanium film, a 200-nm-thick aluminum film, and a 8-nm-thick titanium film are stacked.

In the light-emitting element, a microcavity structure (not shown) including indium tin oxide containing silicon (ITSO) is provided over the first electrode 218. The image display device in this example includes pixels of three colors: a red pixel (R), a green pixel (G), and a blue pixel (B). Here, a 80-nm-thick ITSO film was formed in the red pixel (R), and a 40-nm-thick ITSO film was formed in the green pixel (G). An ITSO film was not formed in the blue pixel (B) (that is, the thickness of the ITSO film in the blue pixel was 0 nm).

Next, an insulating layer 224 covering an end portion of the first electrode 218 was formed. As the insulating layer 224, a 1.5-μm-thick polyimide film was formed with a spin coater. After that, heat treatment was performed at 250° C. for one hour in an oxygen atmosphere. The width of the insulating layer 224 was 12 μm (see the width L1 in FIG. 11A).

Next, a partition 250 formed of a photosensitive polyimide resin was formed over the insulating layer 224. The width, length, and height (thickness) of the partition 250 were 5 μm (see the width L2 in FIG. 11A), 70 μm, and 1.5 μm, respectively.

Figure 10:
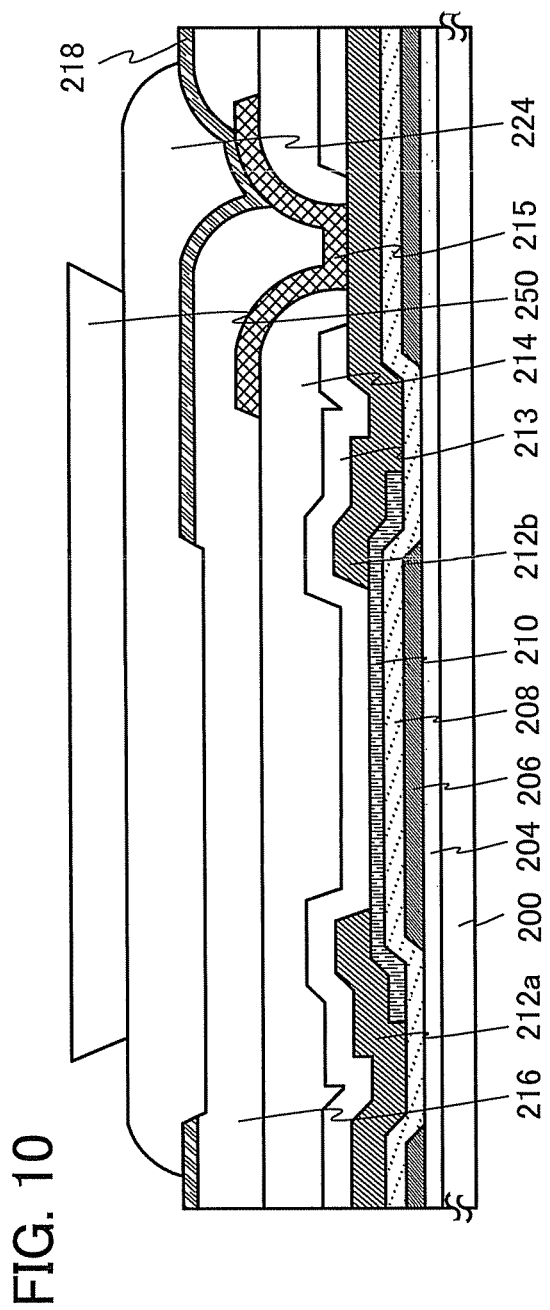
FIG. 10 is a cross-sectional view according to Example 1.

FIG. 10 illustrates an example of a cross-sectional view of the image display device in this example at this stage.

Figure 11A:
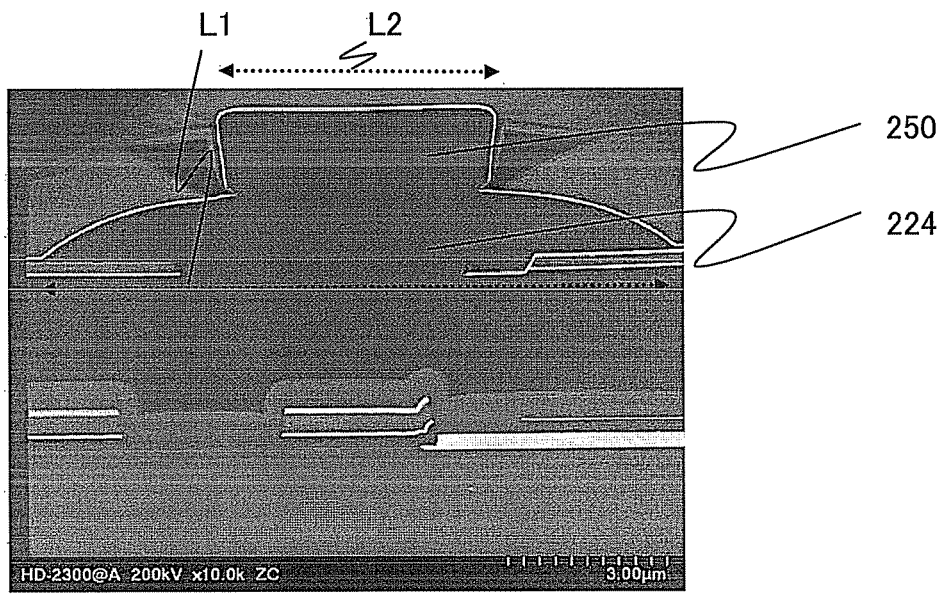
FIGS. 11A and 11B are a cross-sectional photograph and a photograph showing light emission, respectively, according to Example 1.

FIG. 11A shows a cross-sectional photograph of the image display device in this example at this stage obtained by scanning transmission electron microscopy (STEM).

Figure 12:
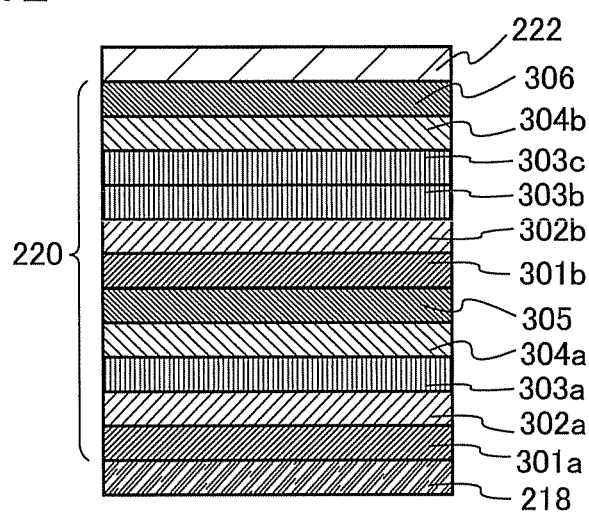
FIG. 12 illustrates an EL layer used in Examples 1 and 2.

Then, an EL layer 220 was formed by evaporation. FIG. 12 illustrates a structure of the EL layer 220. Structural formulae of materials used in this example are shown below.

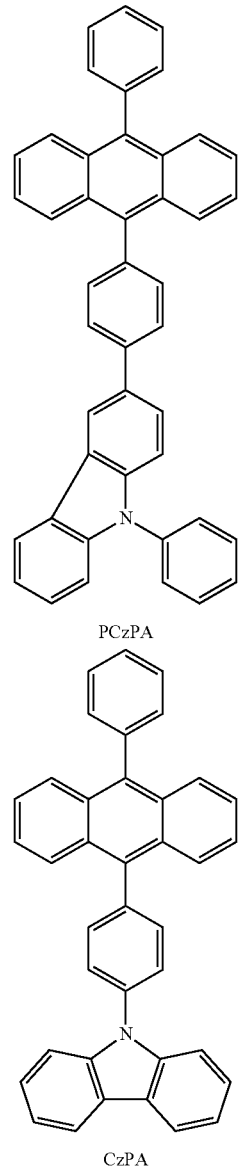 [SMILES: c1ccc(-c2c3ccccc3c(-c3ccc(-c4ccc5c(c4)c4ccccc4n5-c4ccccc4)cc3)c3ccccc23)cc1 ; c1ccc(-c2c3ccccc3c(-c3ccc(-n4c5ccccc5c5ccccc54)cc3)c3ccccc23)cc1]

PCzPA

CzPA

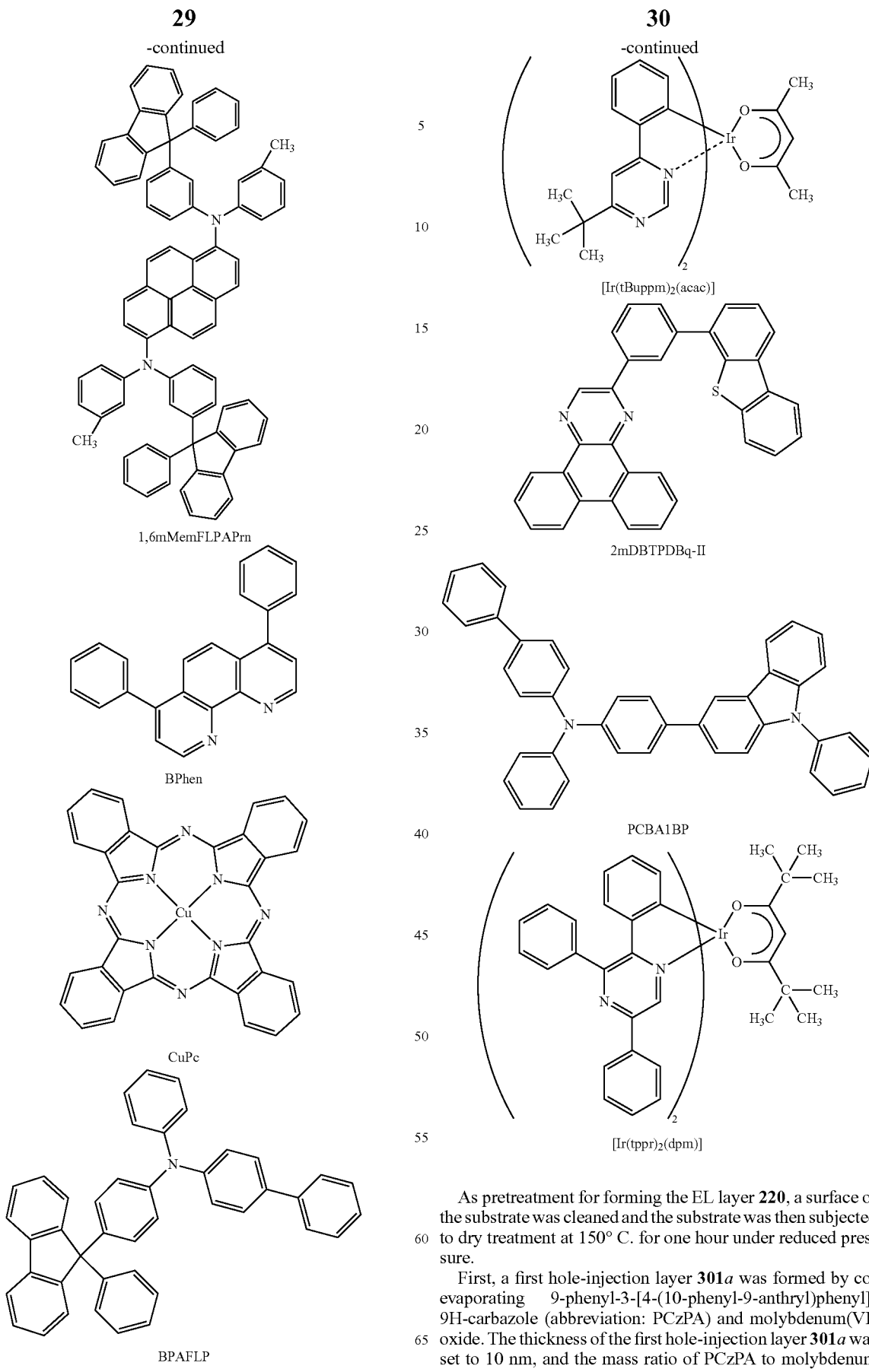

As pretreatment for forming the EL layer 220, a surface of the substrate was cleaned and the substrate was then subjected to dry treatment at 150° C. for one hour under reduced pressure.

First, a first hole-injection layer 301a was formed by co-evaporating 9-phenyl-3-[4-(10-phenyl-9-anthryl)phenyl]-9H-carbazole (abbreviation: PCzPA) and molybdenum(VI) oxide. The thickness of the first hole-injection layer 301a was set to 10 nm, and the mass ratio of PCzPA to molybdenum oxide was adjusted to 2:1 (=PCzPA:molybdenum oxide).

Note that the co-evaporation method refers to an evaporation method in which evaporation is carried out from a plurality of evaporation sources at the same time in one treatment chamber.

Next, a PCzPA film was formed to a thickness of 20 nm over the first hole-injection layer 301a to form a first hole-transport layer 302a.

Then, 9-[4-(10-phenyl-9-anthryl)phenyl]-9H-carbazole (abbreviation: CzPA) and N,N'-bis(3-methylphenyl)-N,N'-bis[3-(9-phenyl-9H-fluoren-9-yl)phenyl]-pyrene-1,6-diamine (abbreviation: 1,6mMemFLPAPrn) were co-evaporated over the first hole-transport layer 302a, so that a blue light-emitting layer 303a was formed. The thickness of the blue light-emitting layer 303a was set to 30 nm, and the mass ratio of CzPA to 1,6mMemFLPAPrn was adjusted to 9:1 (=CzPA: 1,6mMemFLPAPrn).

Next, over the blue light-emitting layer 303a, a film of CzPA was formed to a thickness of 10 nm and then a film of bathophenanthroline (abbreviation: BPhen) was formed to a thickness of 10 nm, so that a first electron-transport layer 304a was formed.

Next, over the first electron-transport layer 304a, lithium (Li) was evaporated to a thickness of 0.2 nm and then copper phthalocyanine (abbreviation: CuPc) was evaporated to a thickness of 2 nm, so that an intermediate layer 305 was formed.

Next, over the intermediate layer 305, PCzPA and molybdenum(VI) oxide were co-evaporated, whereby a second hole-injection layer 301b was formed. The thickness of the second hole-injection layer 301b was set to 10 nm, and the mass ratio of PCzPA to molybdenum oxide was adjusted to 2:1 (=PCzPA:molybdenum oxide).

Next, over the second hole-injection layer 301b, a film of 4-phenyl-4'-(9-phenylfluoren-9-yl)triphenylamine (abbreviation: BPAFLP) was formed to a thickness of 20 nm to form a second hole-transport layer 302b.

Next, 2-[3-(dibenzothiophen-4-yl)phenyl]dibenzo[f,h]quinoxaline (abbreviation: 2mDBTPDBq-II), 4-phenyl-4'-(9-phenyl-9H-carbazol-3-yl)triphenylamine (abbreviation: PCBA1BP), and (acetylacetonato)bis(6-tert-butyl-4-phenylpyrimidinato)iridium(III) (abbreviation: [Ir(tBuppm)$_2$(acac)]) were co-evaporated to form a green light-emitting layer 303b over the second hole-transport layer 302b. Here, the mass ratio of 2mDBTPDBq-II to PCBA1BP and [Ir(tBuppm)$_2$(acac)] was adjusted to 0.74:0.18:0.08 (=2mDBTPDBq-II: PCBA1BP:[Ir(tBuppm)$_2$(acac)]). The thickness of the green light-emitting layer 303b was set to 20 nm.

Further, 2mDBTPDBq-II and (dipivaloylmethanato)bis(2,3,5-triphenylpyrazinato)iridium(III) (abbreviation: [Ir(tppr)$_2$(dpm)]) were co-evaporated, whereby a red light-emitting layer 303c was formed over the green light-emitting layer 303b. Here, the mass ratio of 2mDBTPDBq-II to [Ir(tppr)$_2$(dpm)] was adjusted to 0.94:0.06 (=2mDBTPDBq-II: [Ir(tppr)$_2$(dpm)]). The thickness of the red light-emitting layer 303c was set to 20 nm.

Next, over the red light-emitting layer 303c, a film of 2mDBTPDBq-II was formed to a thickness of 15 nm and a film of BPhen was formed to a thickness of 20 nm to form a second electron-transport layer 304b.

Further, lithium fluoride (LiF) was evaporated to a thickness of 1 nm over the second electron-transport layer 304b, whereby an electron-injection layer 306 was formed.

Then, magnesium (Mg) and silver (Ag) were co-evaporated to a thickness of 15 nm, and a film of ITO was formed to a thickness of 70 nm, whereby a second electrode 222 was formed. The mass ratio of Mg to Ag was adjusted to 1:10 (=Mg:Ag).

In this manner, the light-emitting element was formed. Note that although the EL layers 220 included in the pixels have the same structure as described above, the microcavity structure enables the light-emitting element of the red pixel to emit red light, the light-emitting element of the green pixel to emit green light, and the light-emitting element of the blue pixel to emit blue light.

An ultraviolet curable resin (XNR5516Z manufactured by Nagase ChemteX Co., Ltd.) was applied, as a sealant, to a glass substrate (AN100, manufactured by Asahi Glass Co., Ltd.) which serves as a counter substrate and is provided with a color filter.

Then, the glass substrate 200 and the glass substrate provided with the color filter were bonded to each other. Bonding was performed by applying pressure of 100 Pa to 20000 Pa.

Then, the sealant was cured by irradiation with a high-pressure mercury lamp for one minute.

After that, heat treatment was performed at 80° C. for one hour in a clean oven.

Lastly, the completed image display device was cut with a scribing machine, whereby the image display device in this example was obtained. Specifically, four image display devices manufactured in the above manner were obtained by dividing the completed image display device into four.

Thus, the image display device to which one embodiment of the present invention is applied was able to be manufactured.

Figure 11B:
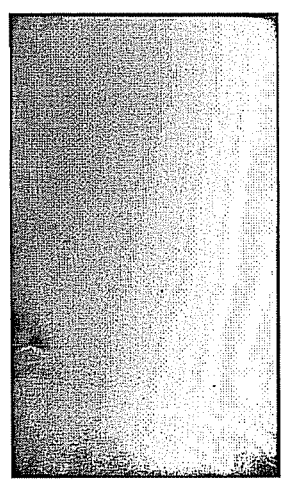

FIG. 11B is a photograph showing one light-emitting unit in an emission state included in the image display device in this example. Light emission of the light-emitting unit was confirmed as shown in FIG. 11B.

Example 2

In this example, an image display device to which one embodiment of the present invention is applied is described with reference to FIG. 12, FIGS. 13A and 13B, FIGS. 14A and 14B, FIGS. 15A and 15B, and FIGS. 16A and 16B.

(Structure and Manufacturing Method of Image Display Device)

Structures and manufacturing methods of an image display device to which one embodiment of the present invention is applied (structural example) and an image display device to which one embodiment of the present invention is not applied (comparative example) are described.

First, a lower electrode of a light-emitting element was formed over a supporting substrate provided with a transistor. The lower electrode is a multi-layer film in which a 200-nm-thick aluminum-nickel alloy film containing lanthanum and a 6-nm-thick titanium film are stacked.

Note that the transistors included in the structural example and the comparative example have the same structure. Specifically, a transistor in which a single crystal silicon film is used as a semiconductor layer is used.

In the light-emitting element, a microcavity structure including indium tin oxide containing silicon (ITSO) is provided over the lower electrode. The structural example and the comparative example each include pixels of three colors: a red pixel (R), a green pixel (G), and a blue pixel (B). The structural example includes a 80-nm-thick ITSO film in the red pixel (R), and a 40-nm-thick ITSO film in the green pixel (G). The comparative example includes a 90-nm-thick ITSO film in the red pixel (R), and a 45-nm-thick ITSO film in the green pixel (G). In each of the structural example and the comparative example, an ITSO film was not formed in the blue pixel (B) (that is, the thickness of the ITSO film in the blue pixel was 0 nm).

Next, an insulating layer covering an end portion of the lower electrode was formed. In the structural example, a 1.8-μm-thick polyimide layer was formed as the insulating layer. In the comparative example, a 1.5-μm-thick polyimide layer was formed as the insulating layer.

Next, a 1.5-μm-thick partition was formed over the insulating layer only in the structural example. A negative resist (ZNP2464 manufactured by ZEON CORPORATION) was used for the partition.

Figure 13A:
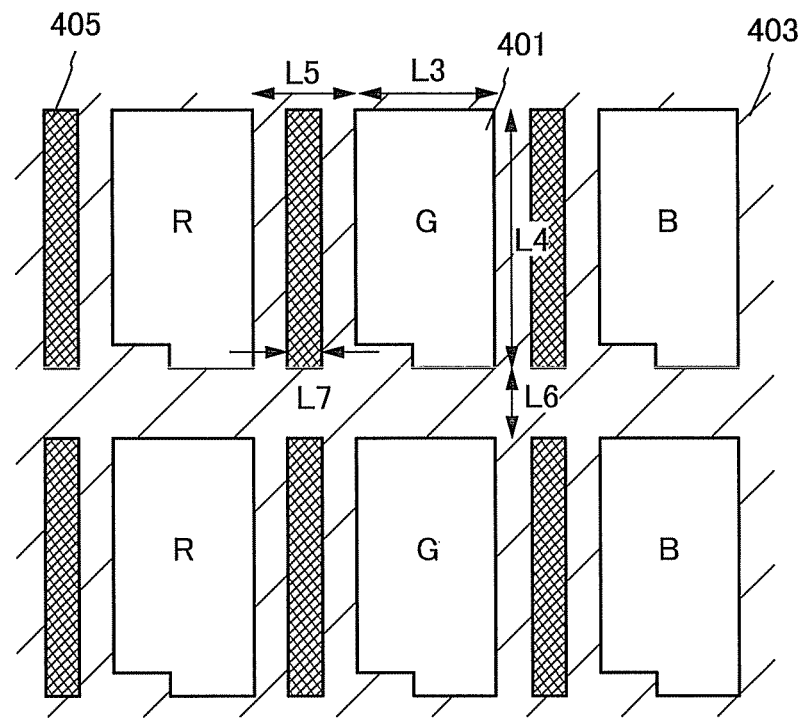
FIGS. 13A and 13B are top views according to Example 2.
Figure 13B:
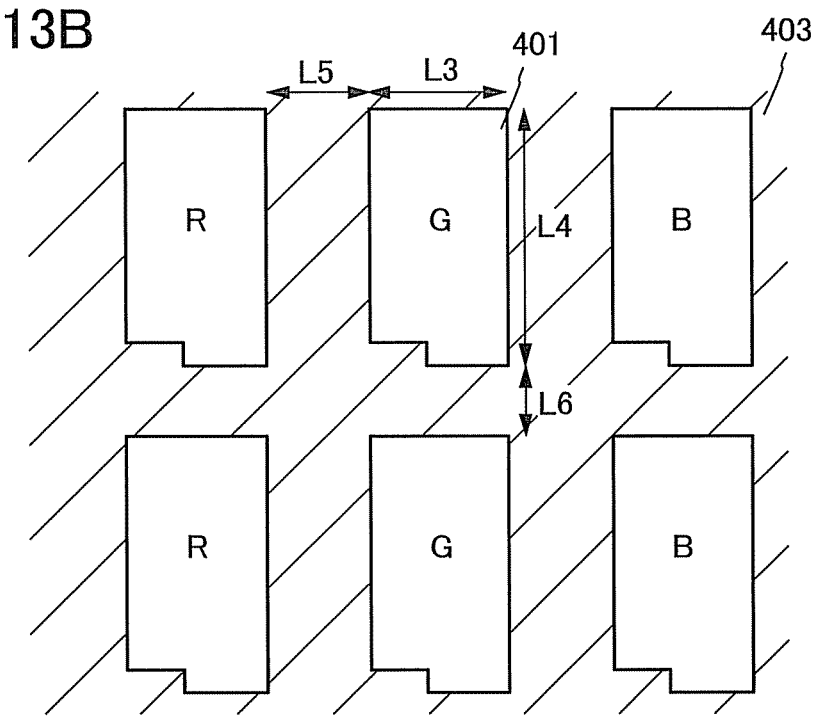

Here, top views of a plurality of light-emitting units 401 in the structural example and the comparative example are illustrated in FIGS. 13A and 13B. FIG. 13A illustrates the structural example, which includes a partition 405 over an insulating layer 403. FIG. 13B illustrates the comparative example, which does not include the partition 405 over the insulating layer 403.

In FIGS. 13A and 13B, the length L3 of the short side of the light-emitting unit 401 is 13.5 μm, and the length L4 of the long side thereof is 50.5 μm. Further, in FIGS. 13A and 13B, the widths L5 and L6 between adjacent light-emitting units 401 are both 5 μm. In FIG. 13A, the length of the long side of the partition 405 is 50.5 μm, which is equal to the length L4 of the long side of the light-emitting unit 401, and the length L7 of the short side of the partition 405 is 3 μm.

Then, the EL layer 220 was formed. FIG. 12 illustrates the structure of the EL layer 220. Note that the first electrode 218 corresponds to the above-described lower electrode, and the second electrode 222 corresponds to an upper electrode which is described below. Materials used for the EL layer 220 are those used in the above example; therefore, structural formulae are omitted. A method for forming the EL layer 220 is described below in detail.

First, the first hole-injection layer 301a was formed by co-evaporating PCzPA and molybdenum(VI) oxide. The thickness of the first hole-injection layer 301a was set to 20 mm, and the mass ratio of PCzPA to molybdenum oxide was adjusted to 2:1 (=PCzPA:molybdenum oxide).

Next, a PCzPA film was formed to a thickness of 20 nm over the first hole-injection layer 301a to form the first hole-transport layer 302a.

Then, CzPA and 1,6mMemFLPAPrn were co-evaporated over the first hole-transport layer 302a, so that the blue light-emitting layer 303a was formed. The thickness of the blue light-emitting layer 303a was set to 30 nm, and the mass ratio of CzPA to 1,6mMemFLPAPm was adjusted to 1:0.05 (=CzPA: 1,6mMemFLPAPrn).

Next, over the blue light-emitting layer 303a, a film of CzPA was formed to a thickness of 5 nm and then a film of BPhen was formed to a thickness of 15 nm, so that the first electron-transport layer 304a was formed.

Next, over the first electron-transport layer 304a, lithium oxide was evaporated to a thickness of 0.1 nm and then CuPc was evaporated to a thickness of 2 nm, so that the intermediate layer 305 was formed.

Next, over the intermediate layer 305, PCzPA and molybdenum(VI) oxide were co-evaporated, whereby the second hole-injection layer 301b was formed. The thickness of the second hole-injection layer 301b was set to 20 nm, and the mass ratio of PCzPA to molybdenum oxide was adjusted to 2:1 (=PCzPA:molybdenum oxide).

Next, over the second hole-injection layer 301b, a BPAFLP film was formed to a thickness of 20 nm to form the second hole-transport layer 302b.

Next, 2mDBTPDBq-II, PCBAlBP, and [Ir(tBuppm)$_2$(acac)] were co-evaporated to form the green light-emitting layer 303b over the second hole-transport layer 302b. Here, the mass ratio of 2mDBTPDBq-II to PCBAlBP and [Ir(tBuppm)$_2$(acac)] was adjusted to 0.8:0.2:0.06 (=2mDBTPDBq-II: PCBAlBP:[Ir(tBuppm)$_2$(acac)]). The thickness of the green light-emitting layer 303b was set to 20 nm.

Further, 2mDBTPDBq-II and [Ir(tppr)$_2$(dpm)] were co-evaporated, whereby the red light-emitting layer 303c was formed over the green light-emitting layer 303b. Here, the mass ratio of 2mDBTPDBq-II to [Ir(tppr)$_2$(dpm)] was adjusted to 1:0.06 (=2mDBTPDBq-II: [Ir(tppr)$_2$(dpm)]). The thickness of the red light-emitting layer 303c was set to 20 nm.

Next, over the red light-emitting layer 303c, a film of 2mDBTPDBq-II was formed to a thickness of 15 nm and a film of BPhen was formed to a thickness of 15 nm to form the second electron-transport layer 304b.

Further, LiF was evaporated to a thickness of 1 nm over the second electron-transport layer 304b, whereby the electron-injection layer 306 was formed.

Then, the second electrode 222 that is the upper electrode was formed over the EL layer. The upper electrode is a multi-layer film in which a 15-nm-thick magnesium-silver alloy film and a 70-nm-thick ITO film are stacked.

In this manner, the light-emitting element was formed.

Next, the supporting substrate and a counter substrate provided with a color filter were bonded to each other with a sealant.

In this manner, the structural example and the comparative example were manufactured.

Figure 14A:
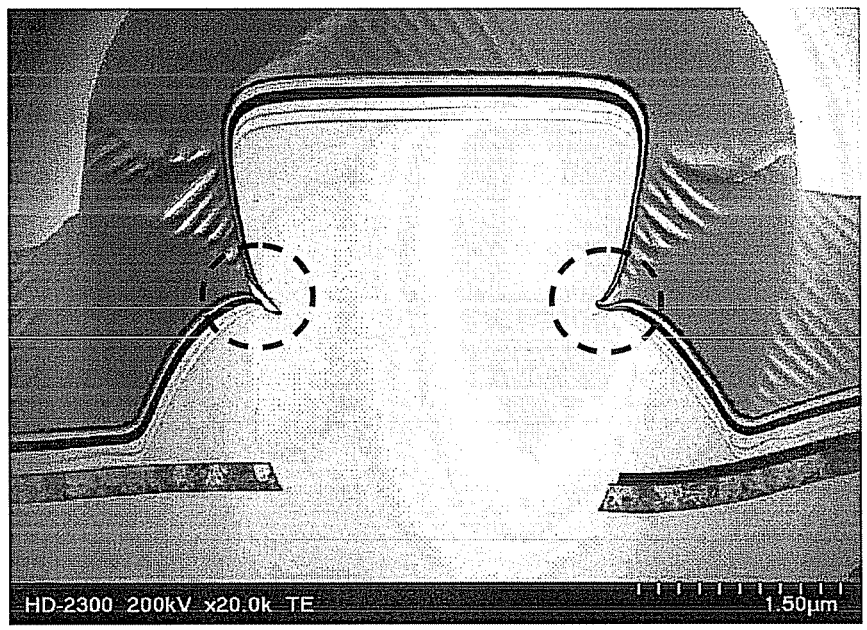
FIGS. 14A and 14B are cross-sectional photographs according to Example 2.
Figure 14B:
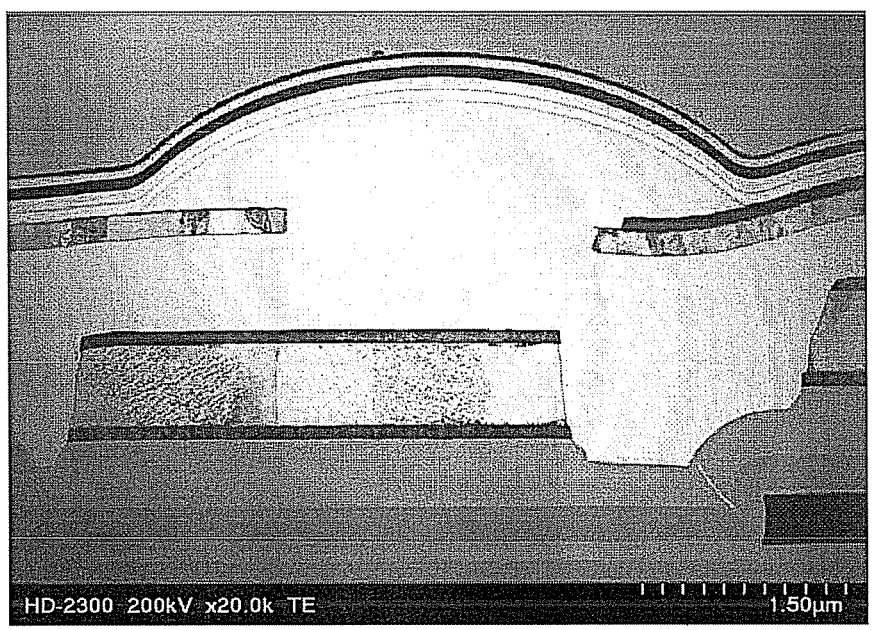

FIG. 14A is a cross-sectional photograph showing the insulating layer and the partition provided in the structural example. The EL layer is separated at dotted line portions in FIG. 14A. FIG. 14B is a cross-sectional photograph showing the insulating layer provided in the comparative example. In FIG. 14B, the EL layer is not separated anywhere.

Figure 15A:
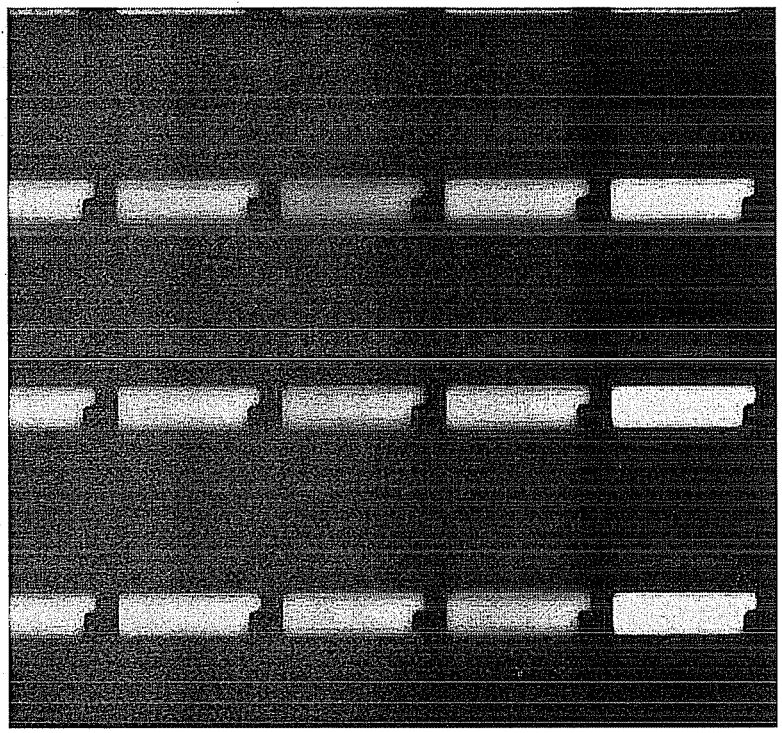
FIGS. 15A and 15B are photographs showing light emission of a structural example in Example 2.
Figure 15B:
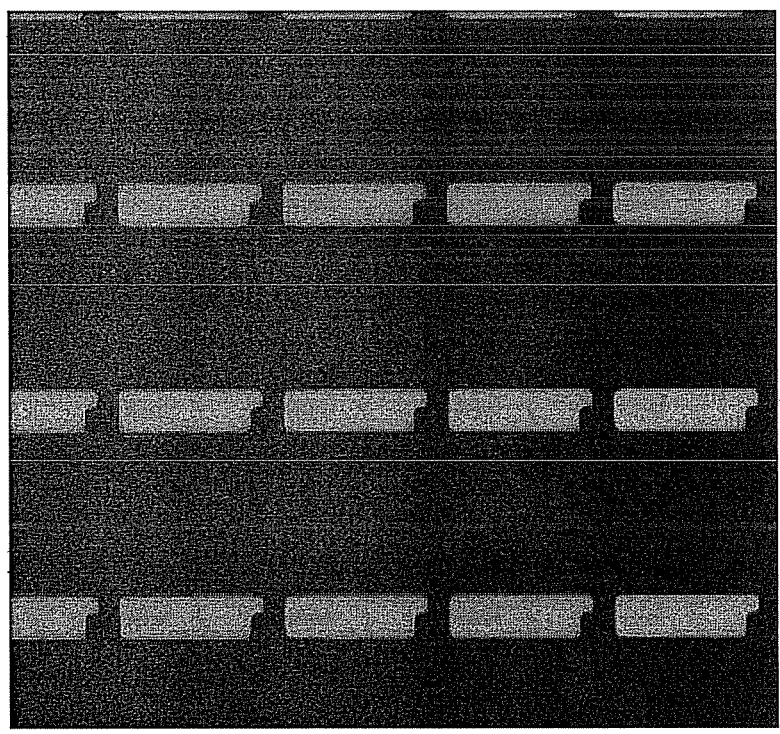
Figure 16A:
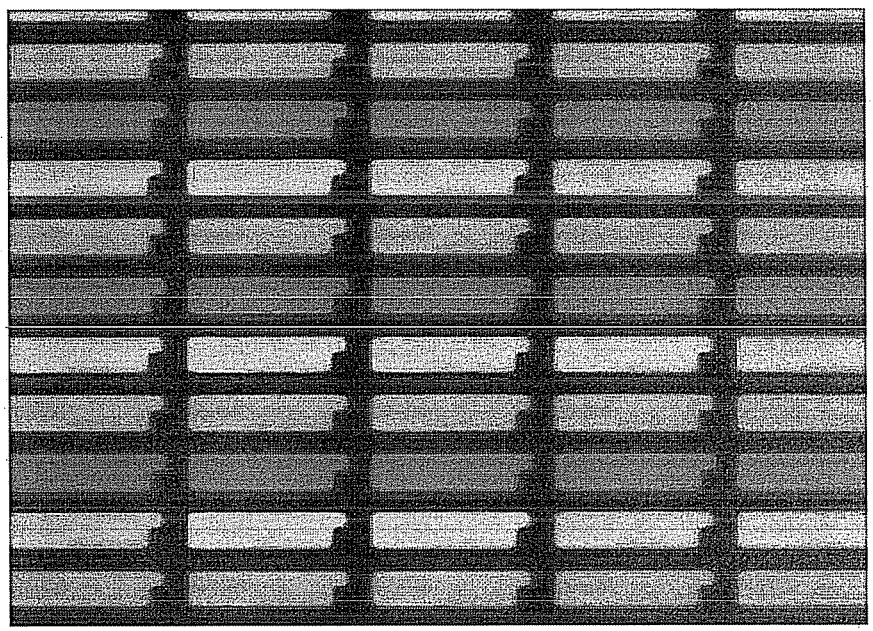
FIGS. 16A and 16B are photographs showing light emission of a comparative example in Example 2.
Figure 16B:
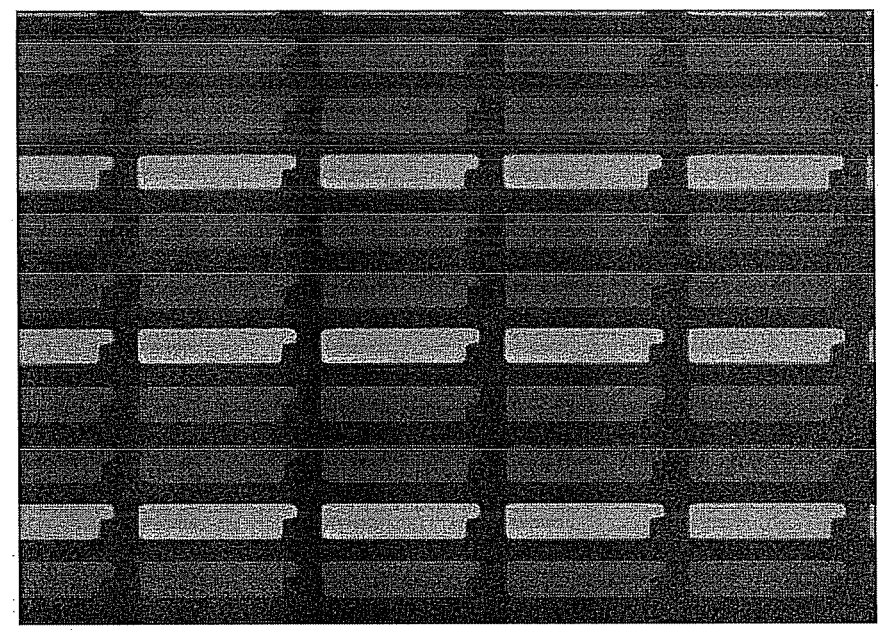

FIGS. 15A and 15B are photographs each showing the structural example during light emission of the blue pixels. FIG. 15A shows the case where the luminance is 5 cd/m$^2$, and FIG. 15B shows the case where the luminance is 150 cd/m$^2$. FIGS. 16A and 16B are photographs each showing the comparative example during light emission of the blue pixels. FIG. 16A shows the case where the luminance is 5 cd/m$^2$, and FIG. 16B shows the case where the luminance is 150 cd/m$^2$.

As shown in FIGS. 16A and 16B, in the comparative example, not only the blue pixels but also the red pixels and the green pixels emit light. In contrast, as shown in FIGS. 15A and 15B, only the blue pixels emit light in the structural example. Further, in FIGS. 15A and 15B, no light-emission defects are observed in the blue pixels.

The results in this example indicate that unintentional light emission of a light-emitting element in a non-emission state can be prevented by provision of an inversely tapered partition between adjacent light-emitting units emitting light of different colors to separate an EL layer (at least a layer having high conductivity) between the light-emitting units. The results also indicate that light-emitting defects caused by a potential drop due to the resistance of an upper electrode can be prevented in adjacent light-emitting units emitting light of the same color.

Reference Example

A method of synthesizing (acetylacetonato)bis(6-tert-butyl-4-phenylpyrimidinato)iridium(III) (abbreviation: [Ir(tBuppm)$_2$(acac)]), which was used in the above examples, is described.

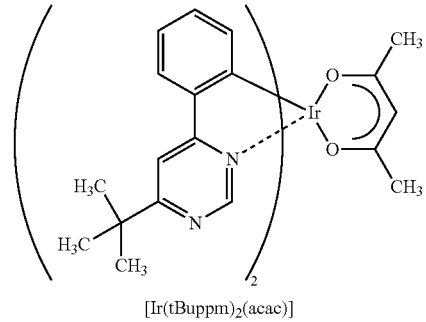

[Ir(tBuppm)$_2$(acac)]

Step 1: Synthesis of 4-tert-butyl-6-phenylpyrimidine (abbreviation: HtBuppm)

The synthesis scheme of Step 1 is shown in (a-1).

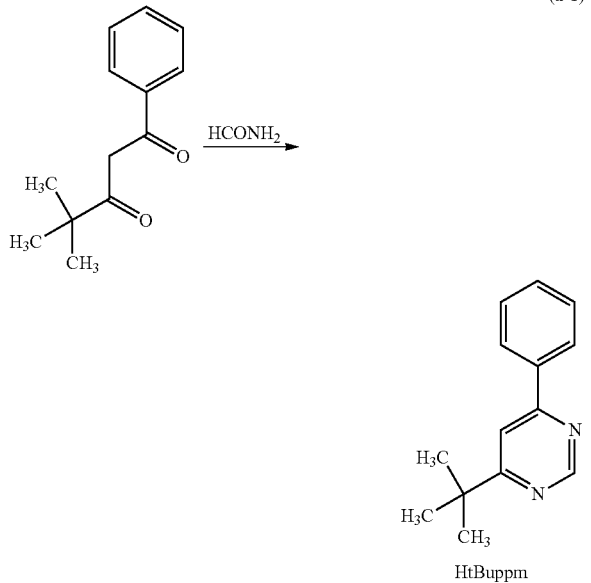

(a-1)

First, into a recovery flask equipped with a reflux pipe were put 22.5 g of 4,4-dimethyl-1-phenylpentane-1,3-dione and 50 g of formamide, and the air in the flask was replaced with nitrogen. This reaction container was heated, so that the reaction solution was refluxed for 5 hours. After that, this solution was poured into an aqueous sodium hydroxide solution, and an organic layer was extracted with dichloromethane. The obtained organic layer was washed with water and saturated saline, and dried with magnesium sulfate. The solution after drying was filtered. The solvent of this solution was distilled off, and then the obtained residue was purified by silica gel column chromatography using hexane and ethyl acetate as a developing solvent in a volume ratio of 10:1, so that a pyrimidine derivative HtBuppm (colorless oily substance, yield of 14%) was obtained.

Step 2: Synthesis of di-μ-chloro-bis[bis(6-tert-butyl-4-phenylpyrimidinato)iridium(III) (abbreviation: [Ir(tBuppm)₂Cl]₂)]

The synthesis scheme of Step 2 is shown in (a-2).

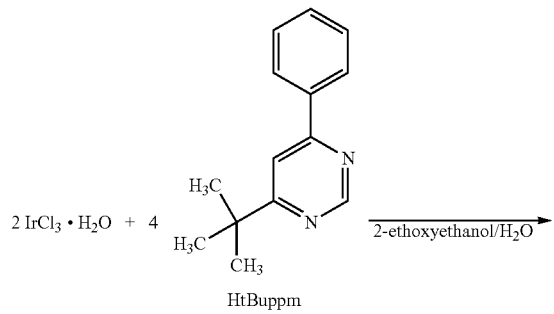

(a-2)

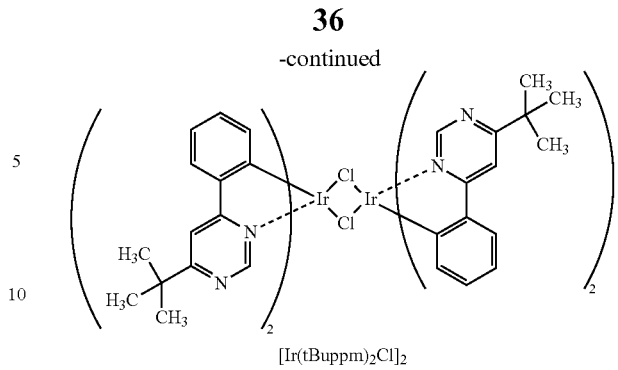

[Ir(tBuppm)₂Cl]₂

Next, into a recovery flask equipped with a reflux pipe were put 15 mL of 2-ethoxyethanol, 5 mL of water, 1.49 g of HtBuppm obtained in Step 1, and 1.04 g of iridium chloride hydrate (IrCl₃.H₂O), and the air in the flask was replaced with argon. After that, irradiation with microwaves (2.45 GHz, 100 W) was performed for one hour to cause a reaction. The solvent was distilled off, and then the obtained residue was suction-filtered and washed with ethanol to give a dinuclear complex [Ir(tBuppm)₂Cl]₂ (yellow green powder, yield of 73%).

Step 3: Synthesis of [Ir(tBuppm)₂(acac)]

The synthesis scheme of Step 3 is shown in (a-3).

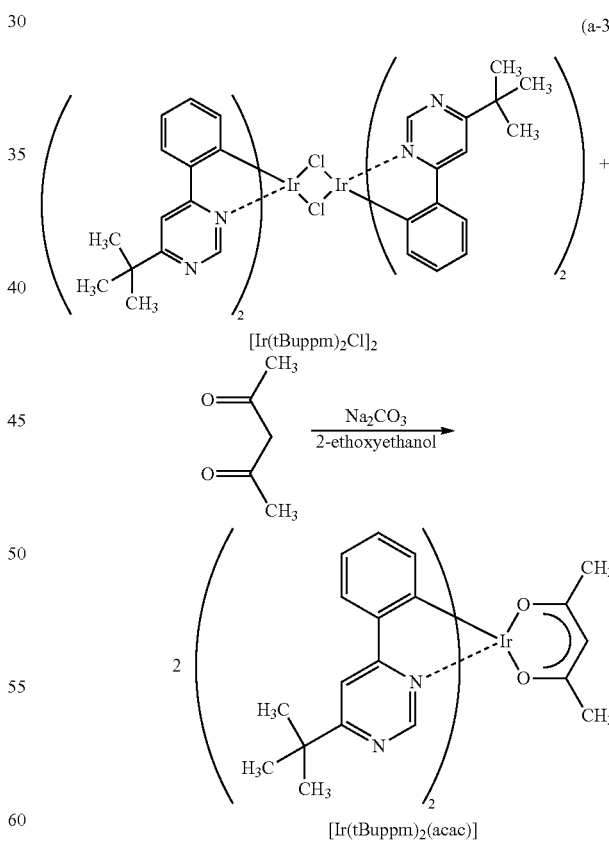

(a-3)

Further, into a recovery flask equipped with a reflux pipe were put 40 mL of 2-ethoxyethanol, 1.61 g of the dinuclear complex [Ir(tBuppm)₂Cl]₂ obtained in Step 2, 0.36 g of acetylacetone, and 1.27 g of sodium carbonate, and the air in the flask was replaced with argon. After that, irradiation with microwaves (2.45 GHz, 120 W) was performed for 60 minutes to cause a reaction. The solvent was distilled off, and the obtained residue was suction-filtered with ethanol and washed with water and ethanol. This solid was dissolved in dichloromethane, and the mixture was filtered through a filter aid in which Celite (produced by Wako Pure Chemical Industries, Ltd., Catalog No. 531-16855), alumina, and Celite were stacked in this order. The solvent was distilled off, and the obtained solid was recrystallized with a mixed solvent of dichloromethane and hexane, so that the objective substance was obtained as yellow powder (yield of 68%).

Analysis results by nuclear magnetic resonance spectrometry ($^1$H-NMR) of the yellow powder obtained in the above Step 3 are shown below. These results show that [Ir(tBuppm)$_2$(acac)] was obtained in this synthesis example.

$^1$H-NMR. δ (CDCl$_3$): 1.50 (s, 18H), 1.79 (s, 6H), 5.26 (s, 1H), 6.33 (d, 2H), 6.77 (t, 2H), 6.85 (t, 2H), 7.70 (d, 2H), 7.76 (s, 2H), 9.02 (s, 2H).

This application is based on Japanese Patent Application serial no. 2011-147616 filed with Japan Patent Office on Jul. 1, 2011, the entire contents of which are hereby incorporated by reference.

What is claimed is:

1. A light-emitting device comprising:
   a first electrode and a second electrode over an insulating surface;
   an insulating layer over a portion of the first electrode and a portion of the second electrode;
   a partition comprising an inversely tapered portion over the insulating layer;
   a first layer including a donor substance and an acceptor substance over the first electrode, the second electrode, the insulating layer and the partition;
   a second layer including a light-emitting substance over the first layer including the donor substance and the acceptor substance;
   a third electrode over the second layer including the light-emitting substance;
   a first color filter over the third electrode; and
   a second color filter over the third electrode,
   wherein the first layer including the donor substance and the acceptor substance and the second layer including the light-emitting substance are electrically separated over the insulating layer at the partition,
   wherein the partition is in contact with the insulating layer, and
   wherein the third electrode is in contact with a side portion of the partition.

2. The light-emitting device according to claim 1, wherein a length of a long side of an upper surface shape of the partition is more than or equal to 90% of a length of a side of the first electrode facing the second electrode.

3. The light-emitting device according to claim 1, wherein the third electrode is electrically connected to a common wiring.

4. The light-emitting device according to claim 3, wherein the common wiring is provided to surround the first electrode and the second electrode.

5. The light-emitting device according to claim 1, wherein the donor substance is an alkali metal, an alkaline earth metal, a rare earth metal, an alkali metal compound, an alkaline earth metal compound, or a rare earth metal compound.

6. The light-emitting device according to claim 1, further comprising:
   a third layer containing a second light-emitting substance between the first layer including the donor substance and the acceptor substance and the second layer including the light-emitting substance; and
   a fourth layer between the second layer including the light-emitting substance and the third layer containing the second light-emitting substance,
   wherein the third layer containing the second light-emitting substance and the fourth layer are separated over the partition.

7. An electronic device comprising the light-emitting device according to claim 1 in a display portion.

8. A light-emitting device comprising:
   a first electrode, a second electrode and a third electrode over an insulating surface;
   a first insulating layer over a portion of the first electrode and a portion of the second electrode;
   a second insulating layer over a portion of the first electrode and a portion of the third electrode;
   a partition comprising an inversely tapered portion over the first insulating layer;
   a first layer including a donor substance and an acceptor substance over the first electrode, the second electrode, the third electrode, the first insulating layer, the second insulating layer and the partition;
   a second layer including a light-emitting substance over the first layer including the donor substance and the acceptor substance;
   a fourth electrode over the second layer including the light-emitting substance;
   a first color filter over the fourth electrode;
   a second color filter over the fourth electrode; and
   a third color filter over the fourth electrode,
   wherein the first layer including the donor substance and the acceptor substance and the second layer including the light-emitting substance are electrically separated over the second insulating layer at the partition,
   wherein the fourth electrode is in contact with a side portion of the partition,
   wherein the first color filter and the third color filter include a same color, and
   wherein the first insulating layer is in contact with the insulating surface between the first electrode and the second electrode.

9. The light-emitting device according to claim 8, wherein a length of a long side of an upper surface shape of the partition is more than or equal to 90% of a length of a side of the first electrode facing the second electrode.

10. The light-emitting device according to claim 8, wherein the fourth electrode is electrically connected to a common wiring.

11. The light-emitting device according to claim 10, wherein the common wiring is provided to surround the first electrode, the second electrode and the third electrode.

12. The light-emitting device according to claim 8, wherein the donor substance is an alkali metal, an alkaline earth metal, a rare earth metal, an alkali metal compound, an alkaline earth metal compound, or a rare earth metal compound.

13. The light-emitting device according to claim 8, further comprising:
   a third layer containing a second light-emitting substance between the first layer including the donor substance and the acceptor substance and the second layer including the light-emitting substance; and
   a fourth layer between the second layer including the light-emitting substance and the third layer containing the second light-emitting substance, wherein the third layer containing the second light-emitting substance and the fourth layer are separated over the partition.

14. An electronic device comprising the light-emitting device according to claim 8 in a display portion.

15. The light-emitting device according to claim 1,
wherein the insulating layer is in contact with the insulating surface between the first electrode and the second electrode.

16. The light-emitting device according to claim 8,
wherein the partition is in contact with the first insulating layer.

17. The light-emitting device according to claim 1,
wherein the partition is an insulator.

18. The light-emitting device according to claim 8,
wherein the partition is an insulator.

* * * * *